United States Patent
Nakabayashi et al.

(10) Patent No.: US 10,141,157 B2
(45) Date of Patent: Nov. 27, 2018

(54) METHOD FOR ADJUSTING HEIGHT OF SAMPLE AND OBSERVATION SYSTEM

(71) Applicant: Hitachi High-Technologies Corporation, Minato-ku, Tokyo (JP)

(72) Inventors: Makoto Nakabayashi, Tokyo (JP); Yuusuke Oominami, Tokyo (JP); Shinsuke Kawanishi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/580,403

(22) PCT Filed: Jun. 29, 2015

(86) PCT No.: PCT/JP2015/068603
§ 371 (c)(1),
(2) Date: Dec. 7, 2017

(87) PCT Pub. No.: WO2017/002152
PCT Pub. Date: Jan. 5, 2017

(65) Prior Publication Data
US 2018/0174796 A1 Jun. 21, 2018

(51) Int. Cl.
*H01J 37/20* (2006.01)
*H01J 37/16* (2006.01)
(Continued)

(52) U.S. Cl.
CPC ............ *H01J 37/20* (2013.01); *H01J 37/16* (2013.01); *H01J 37/18* (2013.01); *H01J 37/22* (2013.01); *H01J 37/26* (2013.01); *H01J 37/32* (2013.01)

(58) Field of Classification Search
CPC .. H01J 37/16; H01J 37/18; H01J 37/20; H01J 37/22; H01J 37/26; H01J 37/32
See application file for complete search history.

(56) References Cited

U.S. PATENT DOCUMENTS

| 2014/0021347 A1 | 1/2014 | Ominami et al. |
| 2014/0246583 A1* | 9/2014 | Ominami ............... H01J 37/16 |
| | | 250/307 |
| 2016/0203944 A1 | 7/2016 | Ominami et al. |

FOREIGN PATENT DOCUMENTS

| JP | 2012-221766 A | 11/2012 |
| WO | WO 2015/033601 A1 | 3/2015 |

OTHER PUBLICATIONS

International Search Report (PCT/ISA/210) issued in PCT Application No. PCT/JP2015/068603 dated Sep. 1, 2015 with English translation (four pages).

(Continued)

*Primary Examiner* — Eliza Osenbaugh-Stewart
(74) *Attorney, Agent, or Firm* — Crowell & Moring LLP

(57) ABSTRACT

In a device for performing observation with a charged particle microscope at an atmospheric pressure using a diaphragm, while there was a demand that a distance between the diaphragm and a sample be reduced as much as possible, there was a problem that a limit for how close the diaphragm and the sample can be brought to each other was unknown in the past. In the present invention, a height adjustment member is used, and the position of a diaphragm in a charged particle beam device with respect to the height adjustment member is defined as the specific point of an optical device, so that the positional relationship between the height adjustment member and the diaphragm in the optical device is reproduced, and the height of a sample table with a Z-axis driving mechanism is adjusted so as to locate the surface of the sample at the position of the specific point of the optical device. According to this, the distance between the diaphragm and the sample can be safely and simply adjusted, and thus, an object is to adjust the distance between the diaphragm and the sample so that the distance is reduced (Continued)

as much as possible or the distance is fixed every time the sample is replaced.

23 Claims, 22 Drawing Sheets

(51) Int. Cl.
*H01J 37/18* (2006.01)
*H01J 37/22* (2006.01)
*H01J 37/26* (2006.01)
*H01J 37/32* (2006.01)

(56) References Cited

OTHER PUBLICATIONS

Japanese-language Written Opinion (PCT/ISA/237) issued in PCT Application No. PCT/JP2015/068603 dated Sep. 1, 2015 (three pages).

\* cited by examiner

[FIG. 1]
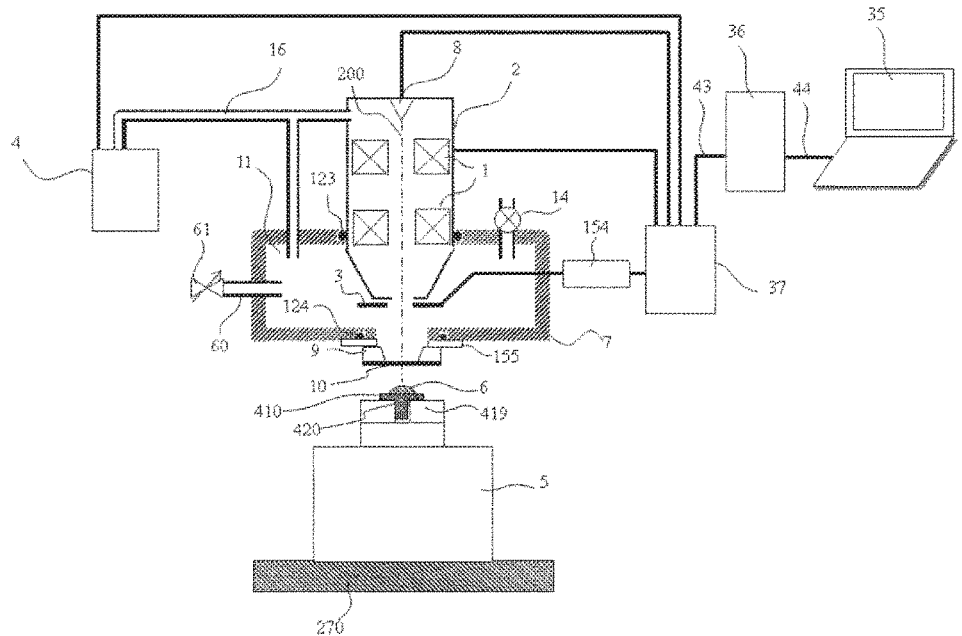
[FIG. 2A]
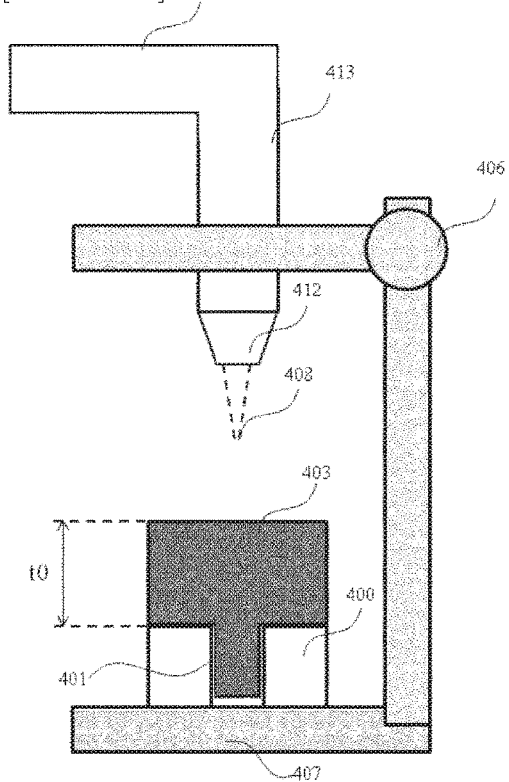
[FIG. 2B]
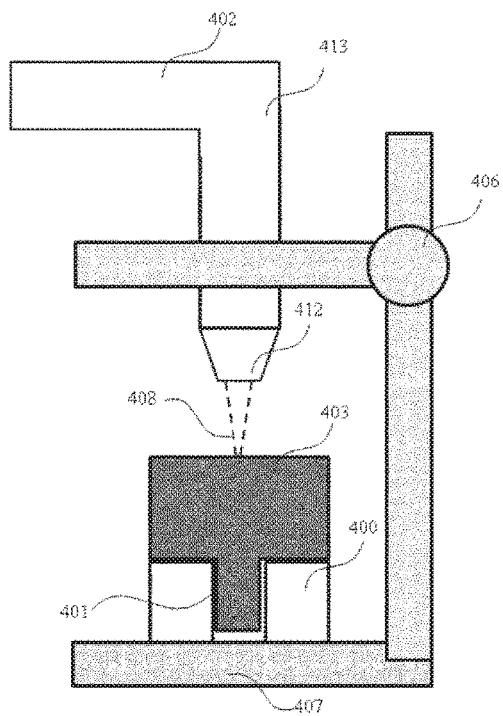

[FIG. 3A]
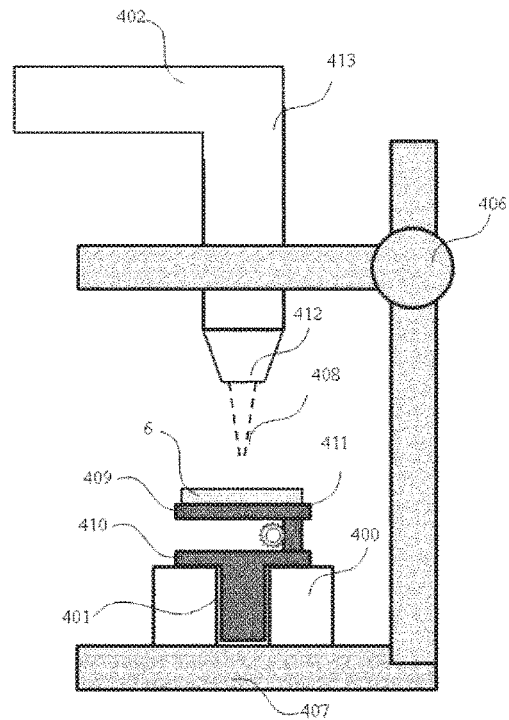
[FIG. 3B]
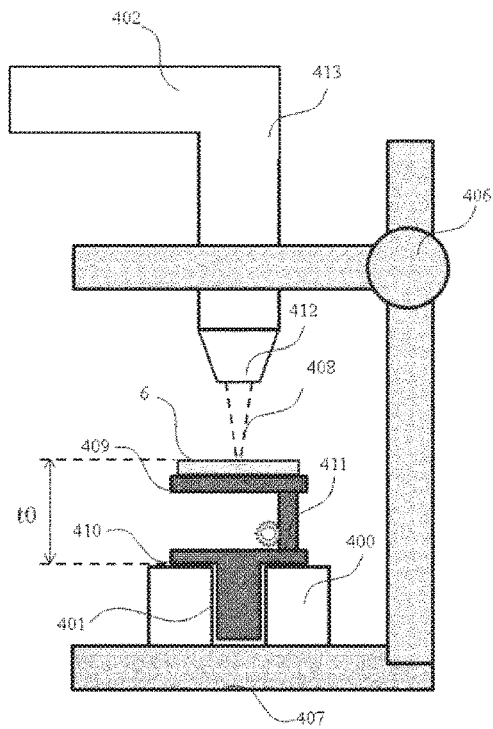
[FIG. 4A]
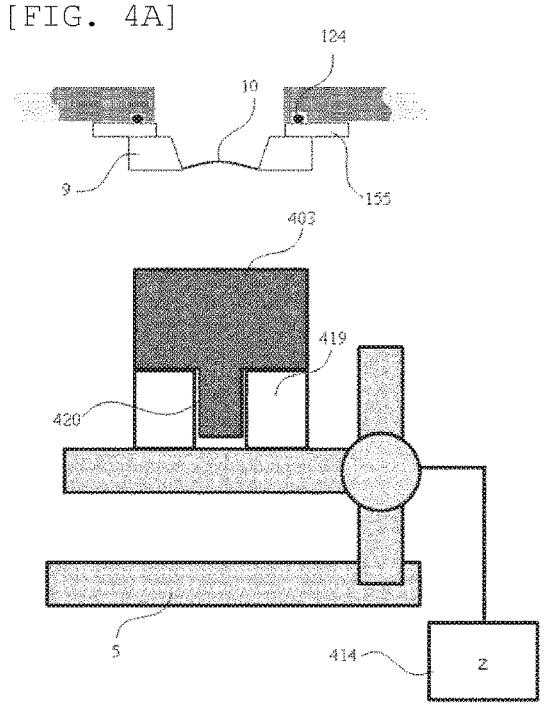
[FIG. 4B]
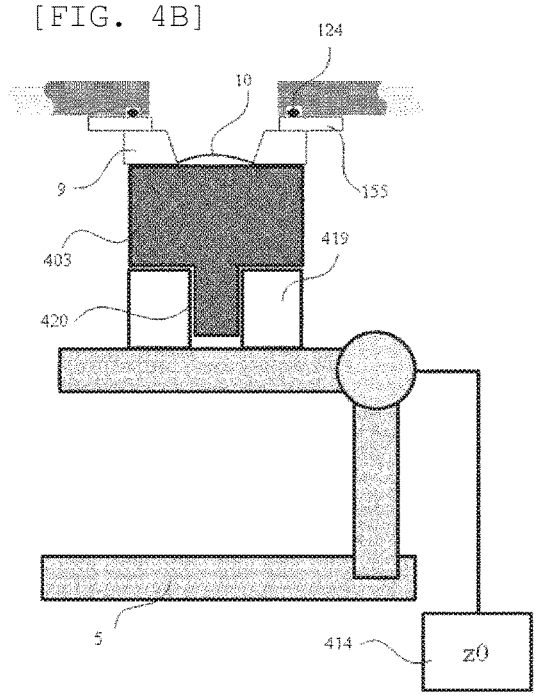

[FIG. 5A]
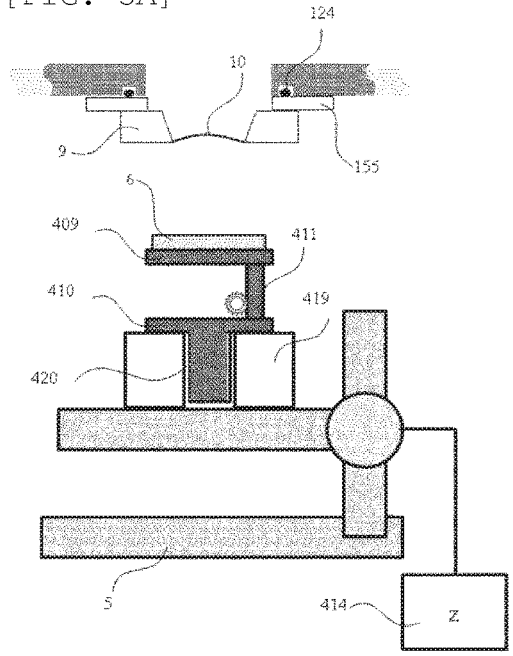
[FIG. 5B]
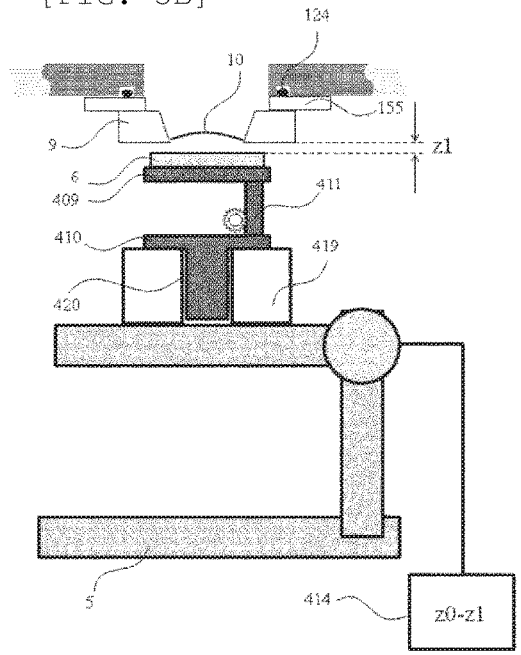
[FIG. 6A]
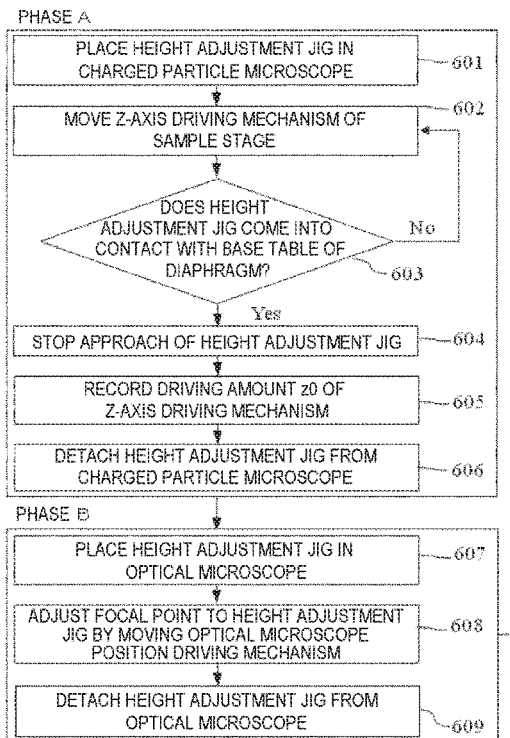
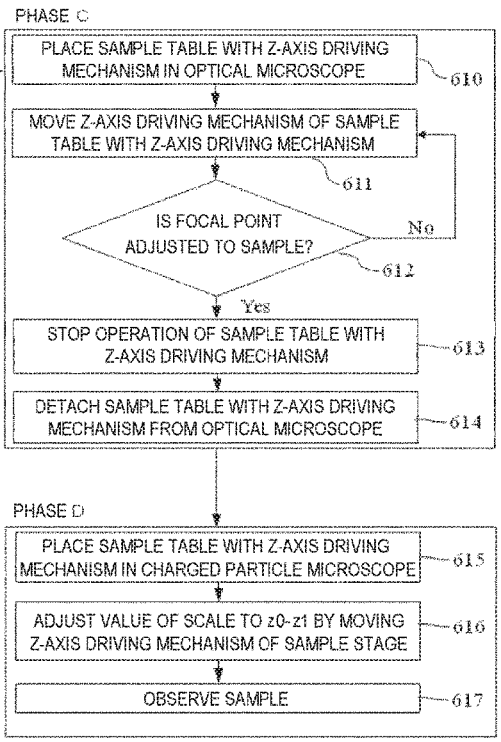

[FIG. 6B]
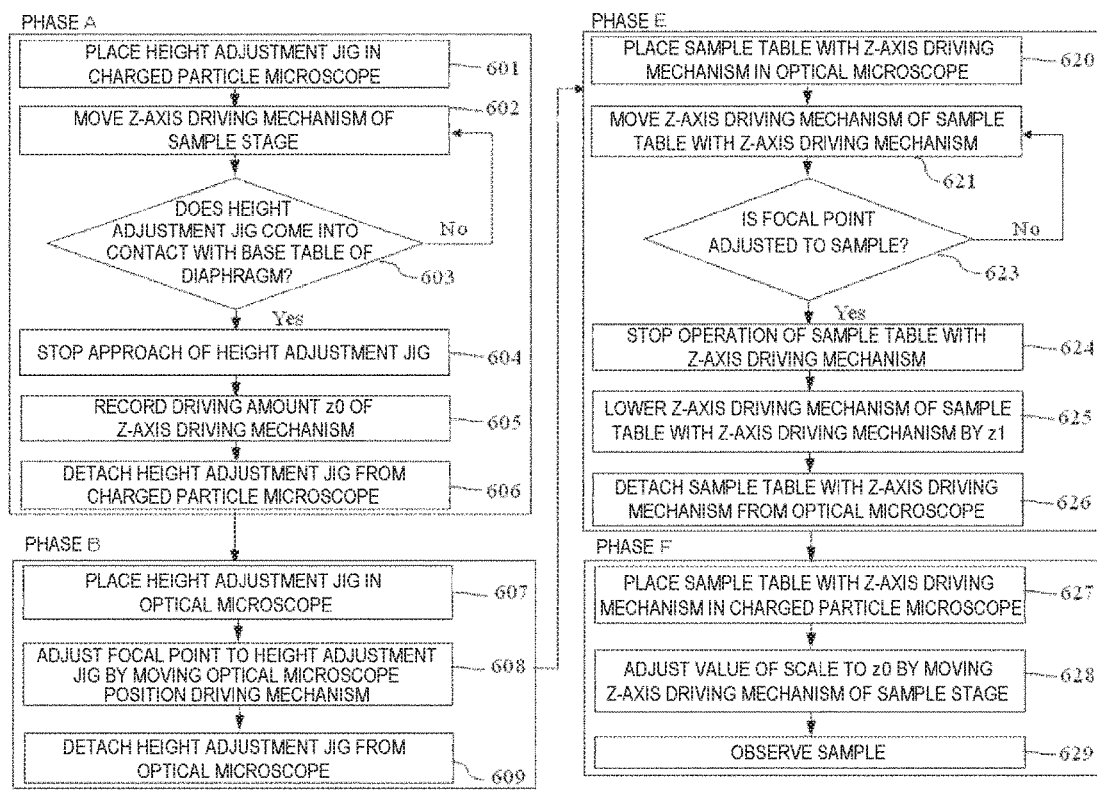

[FIG. 7]
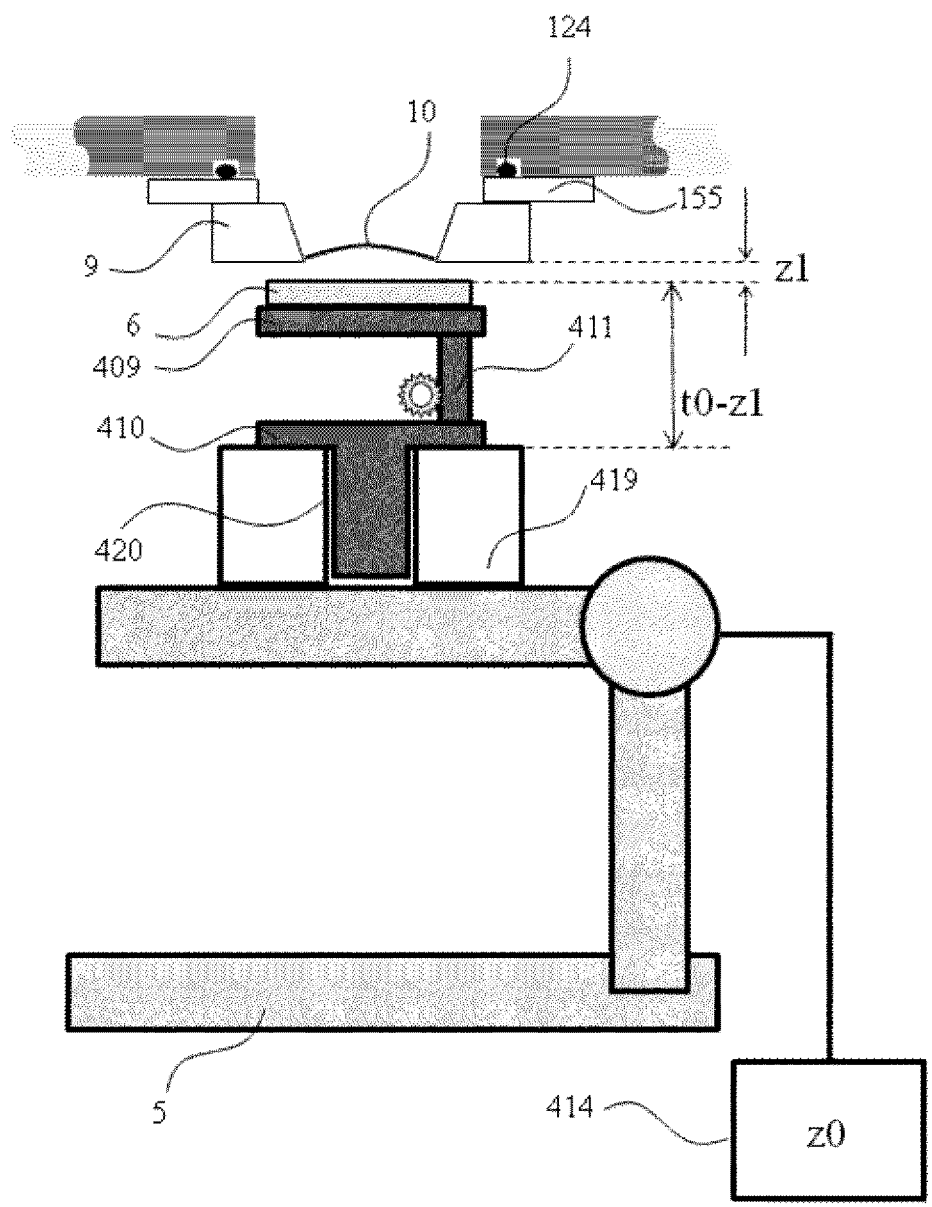

[FIG. 8A] 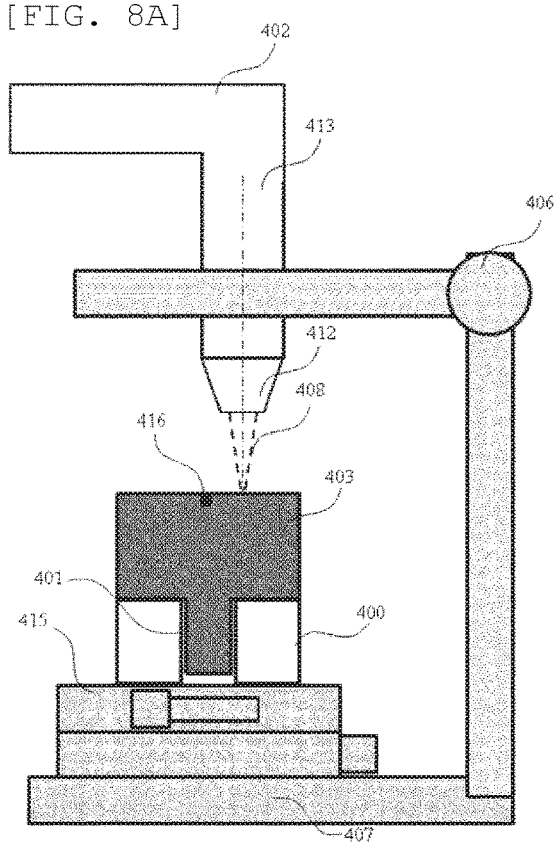 [FIG. 8B] 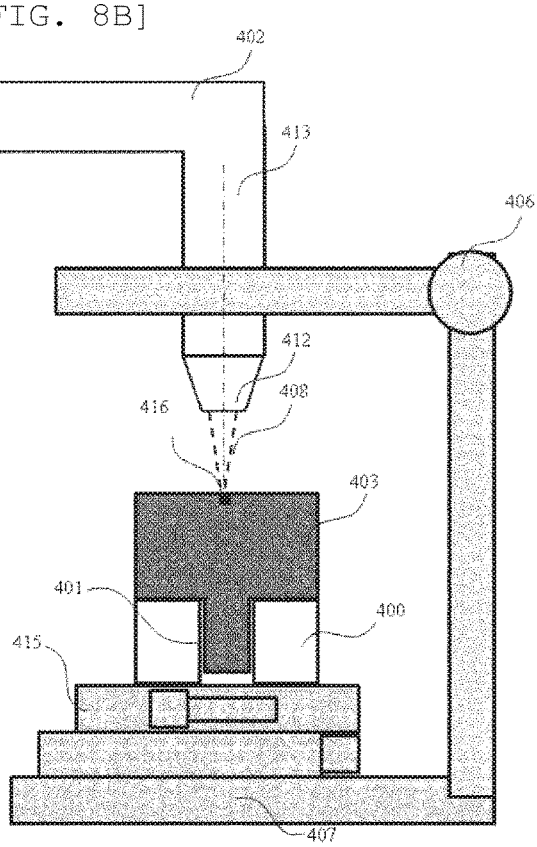

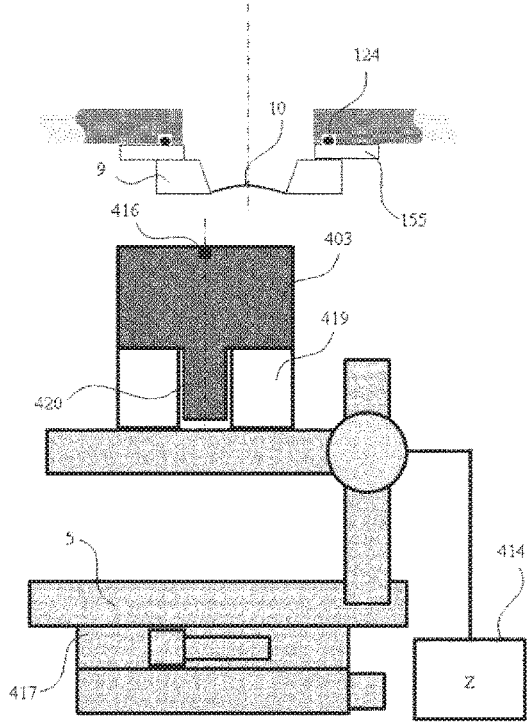
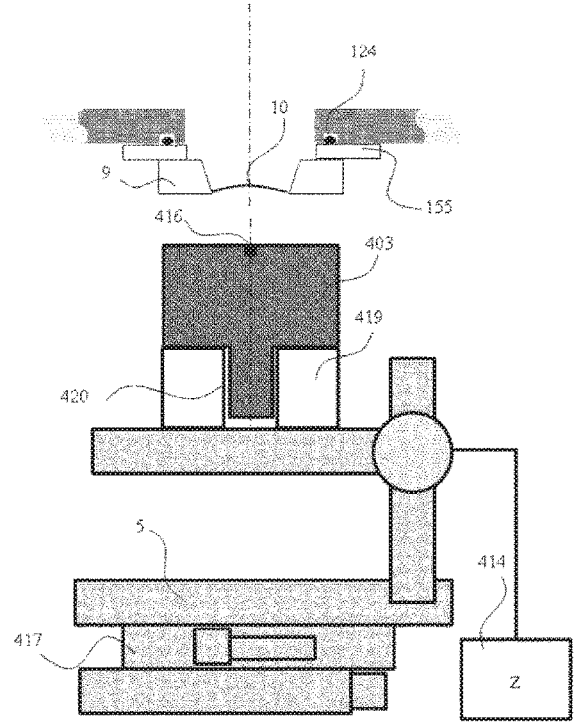
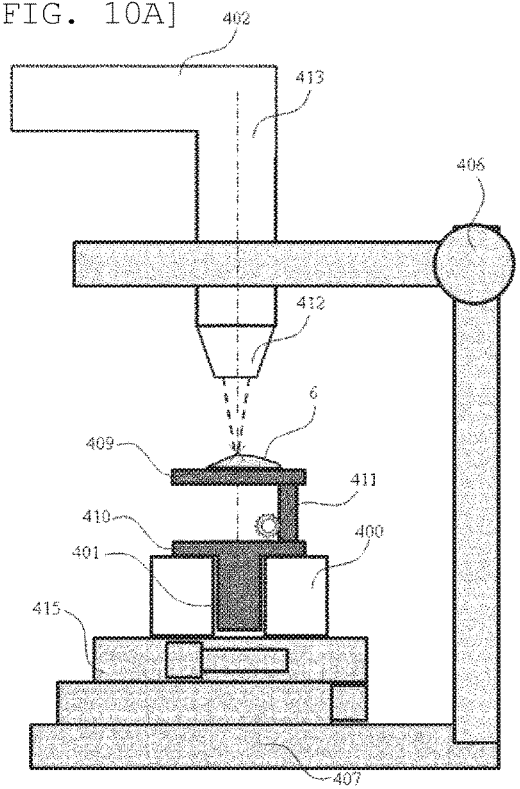
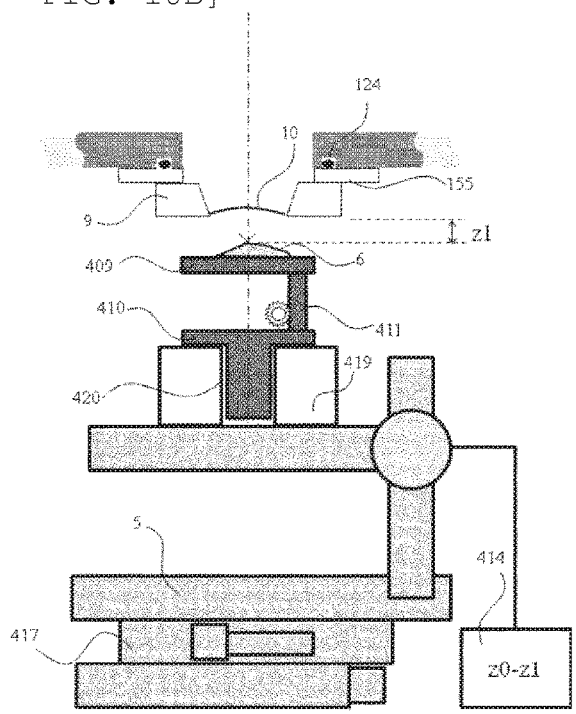

[FIG. 11A]
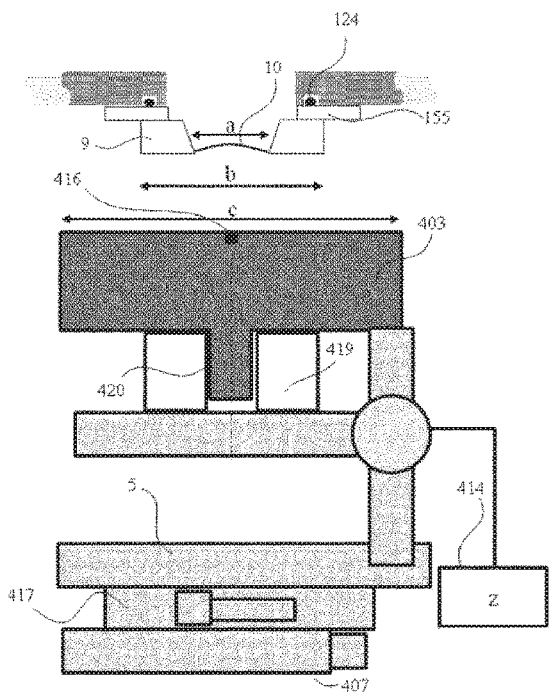
[FIG. 11B]
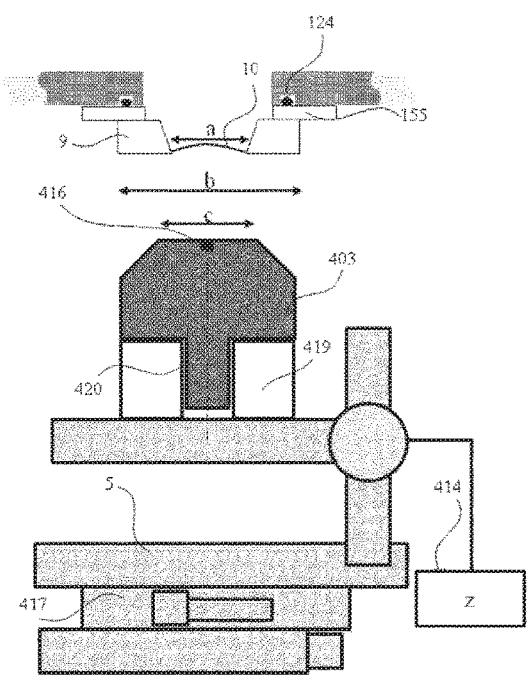
[FIG. 12A]
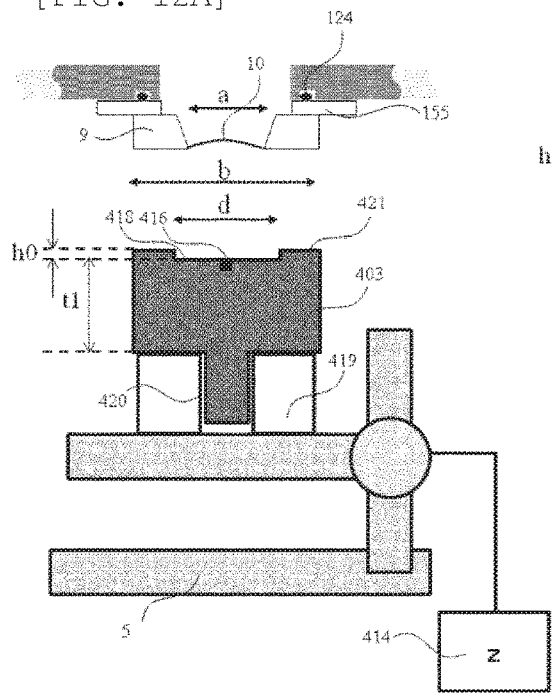
[FIG. 12B]
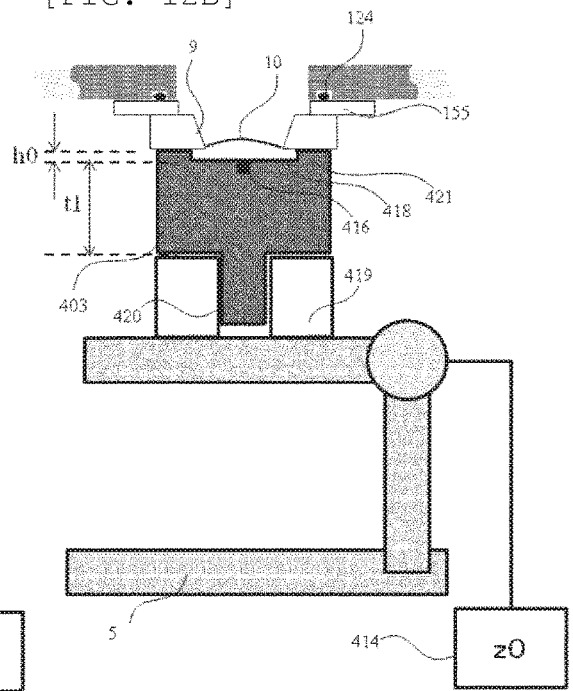

[FIG. 13A]
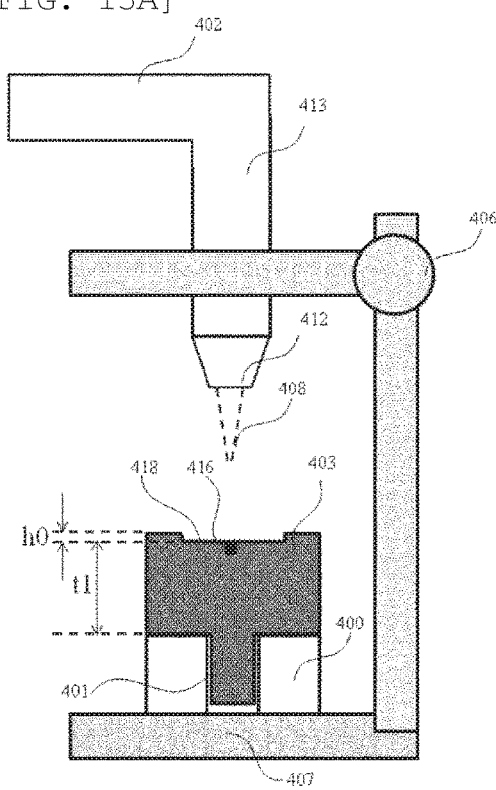
[FIG. 13B]
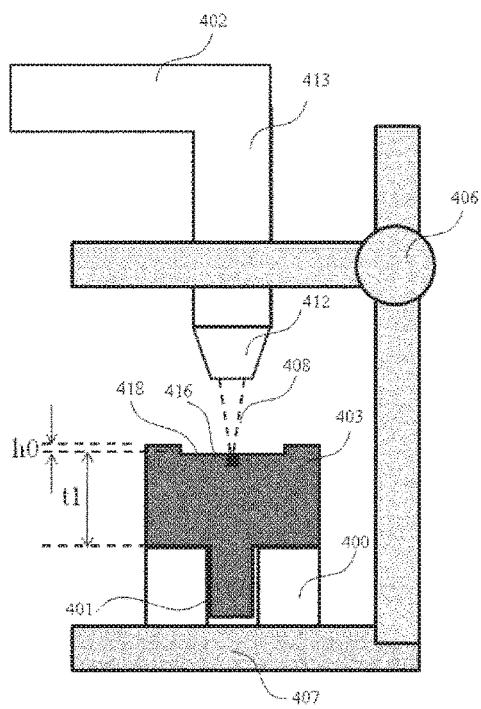
[FIG. 14A]
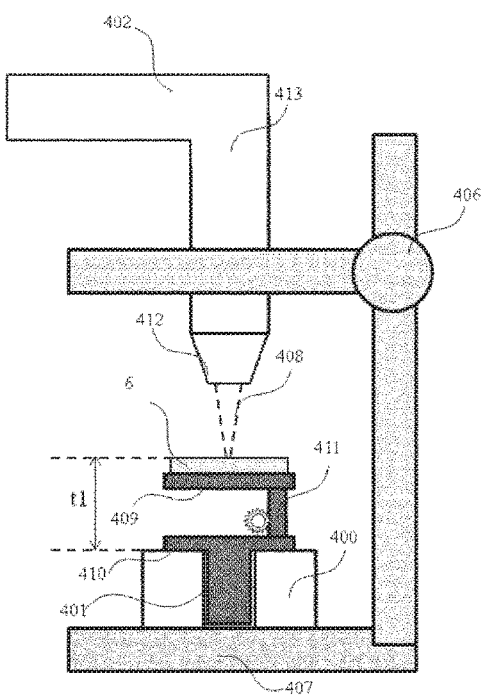
[FIG. 14B]
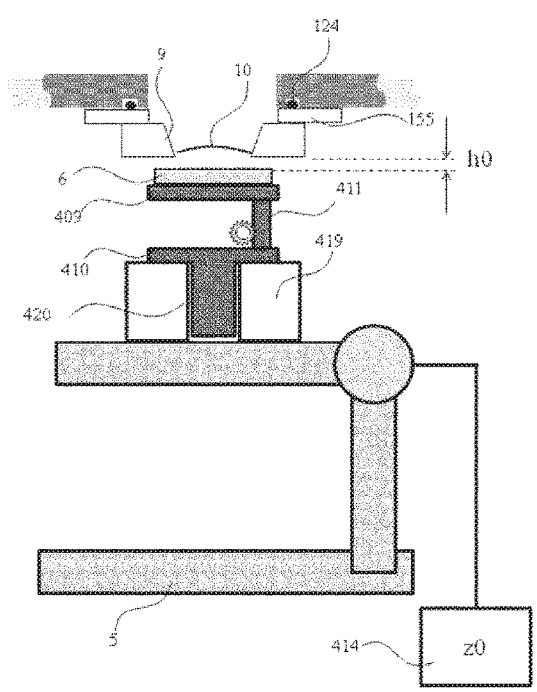

[FIG. 15]
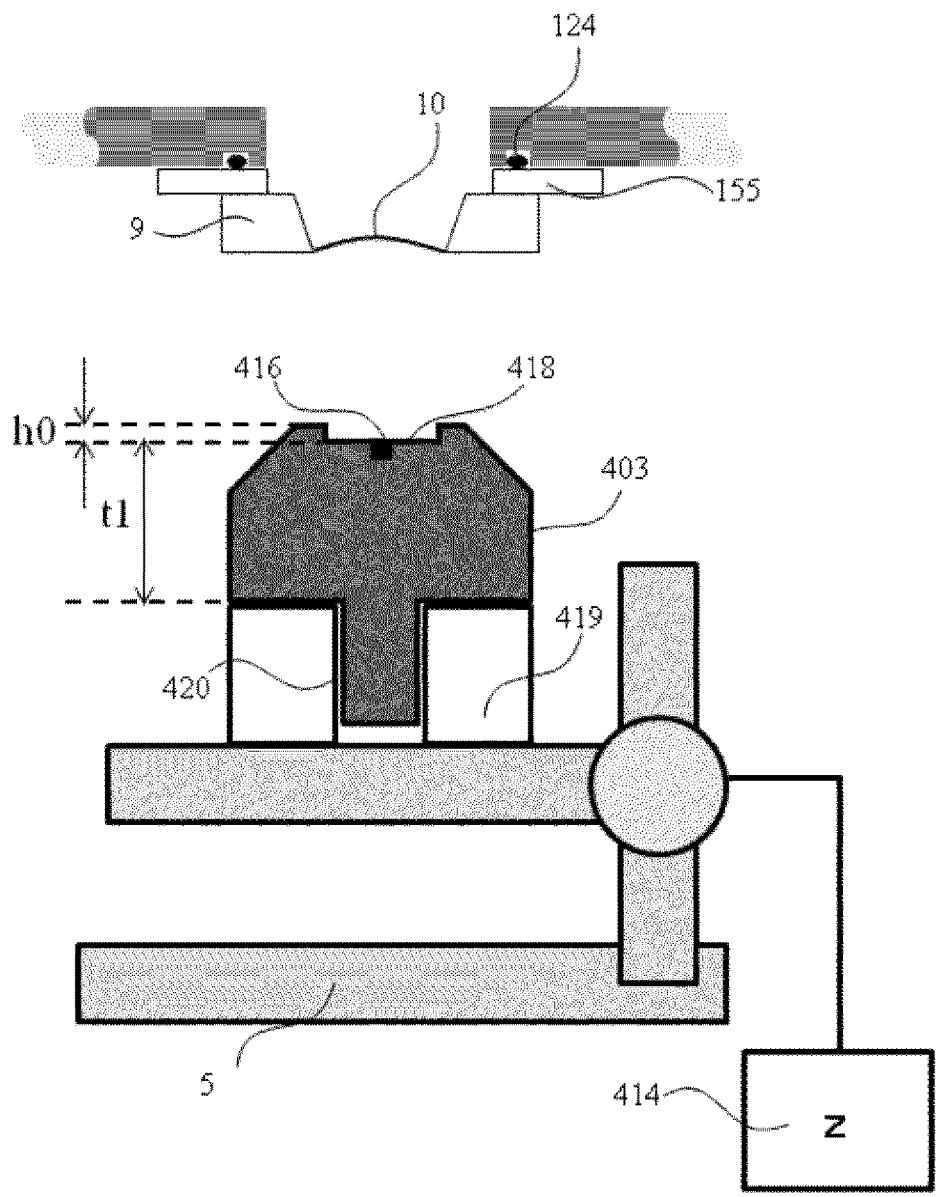

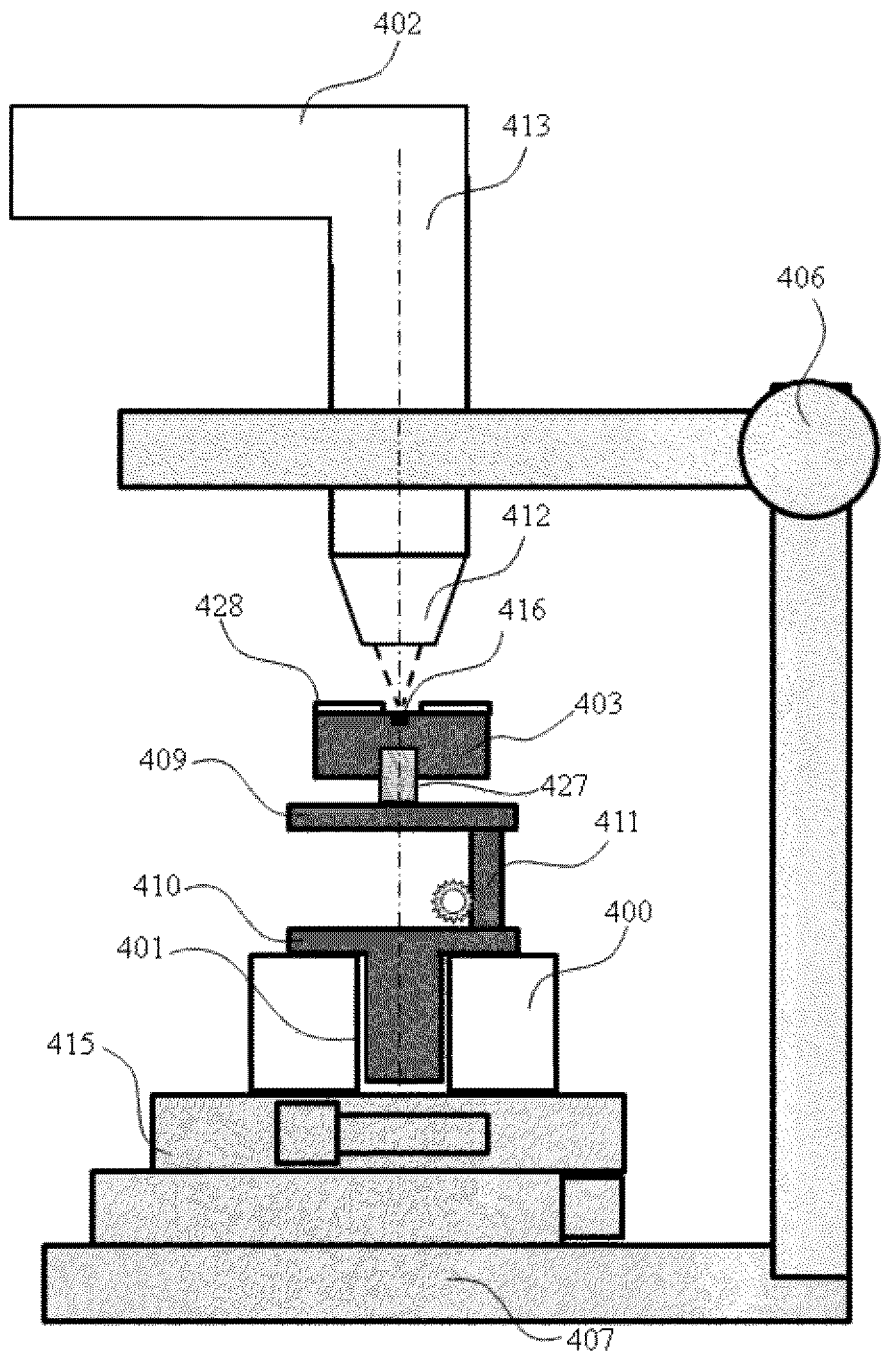
[FIG. 16]

[FIG. 17A]
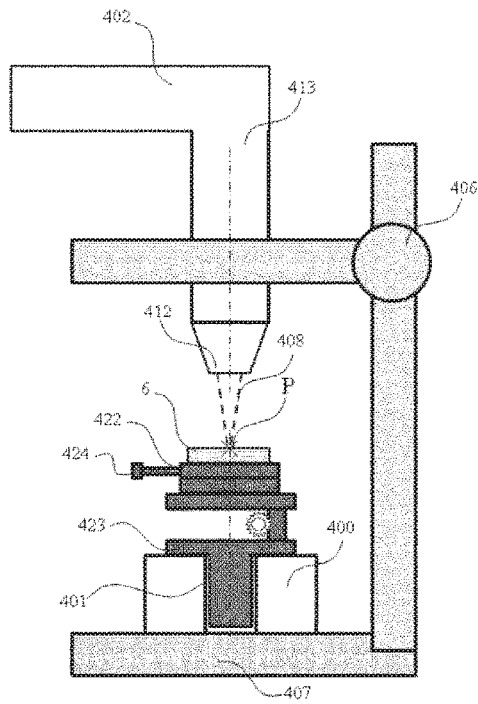
[FIG. 17B]
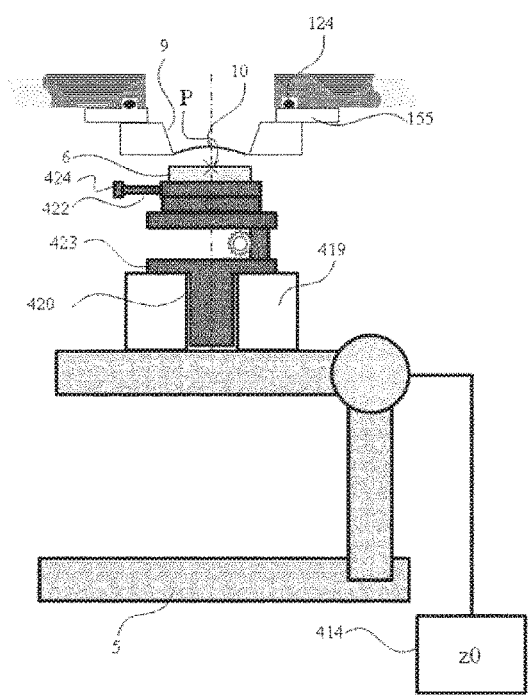
[FIG. 18A]
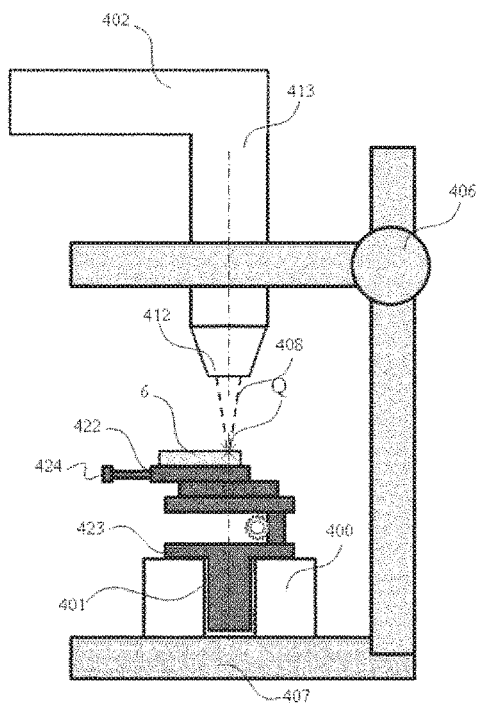
[FIG. 18B]
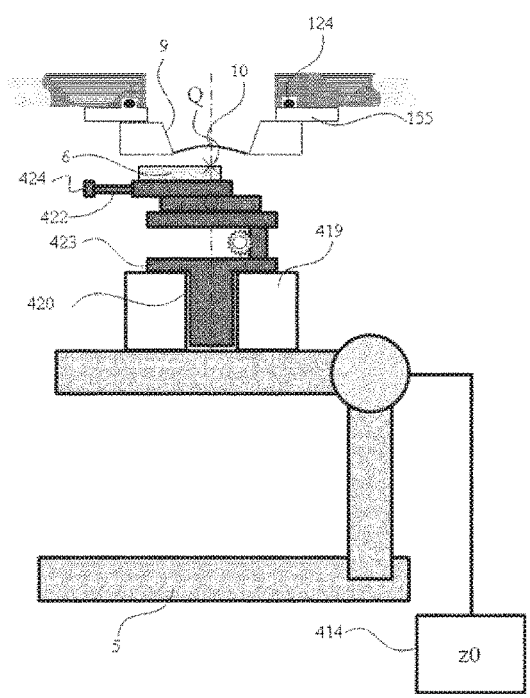

[FIG. 19A] 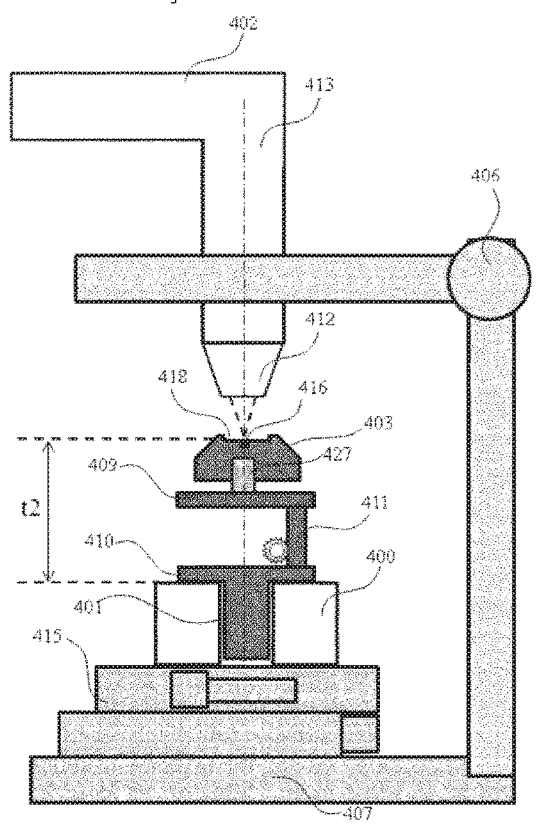
[FIG. 19B] 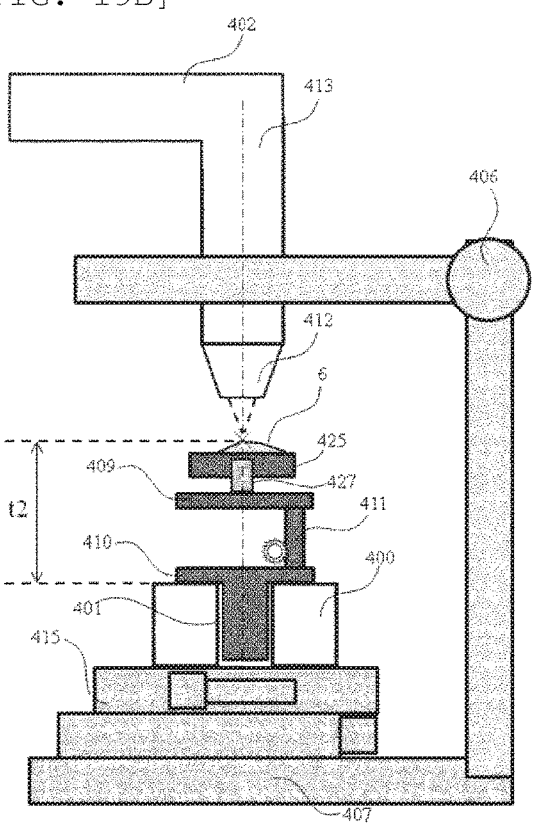

[FIG. 20]
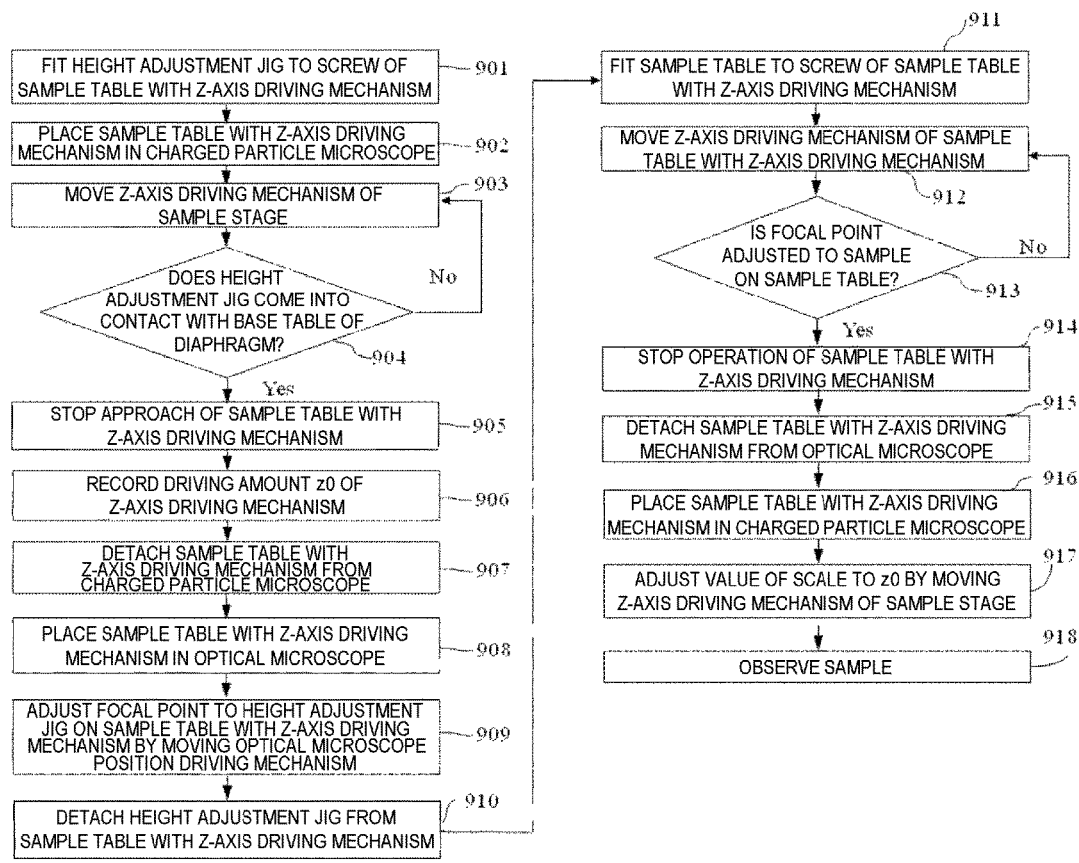

[FIG. 21A]
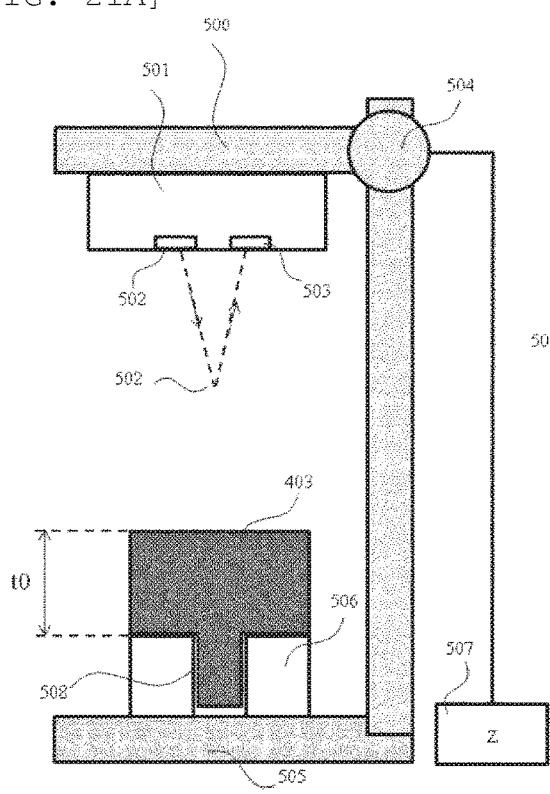
[FIG. 21B]
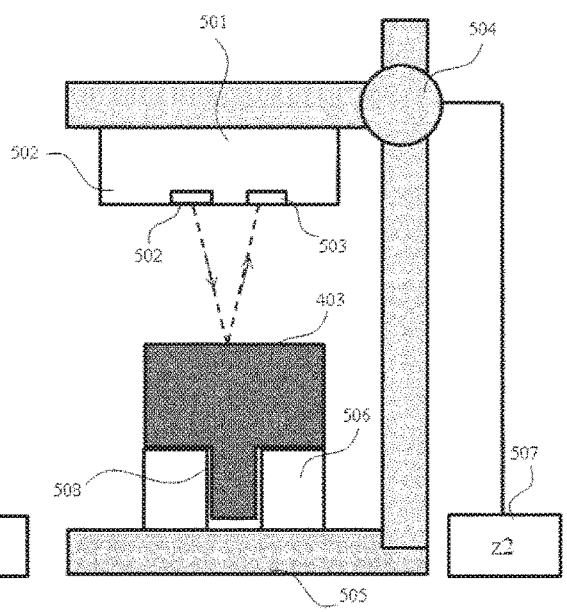

[FIG. 22A]
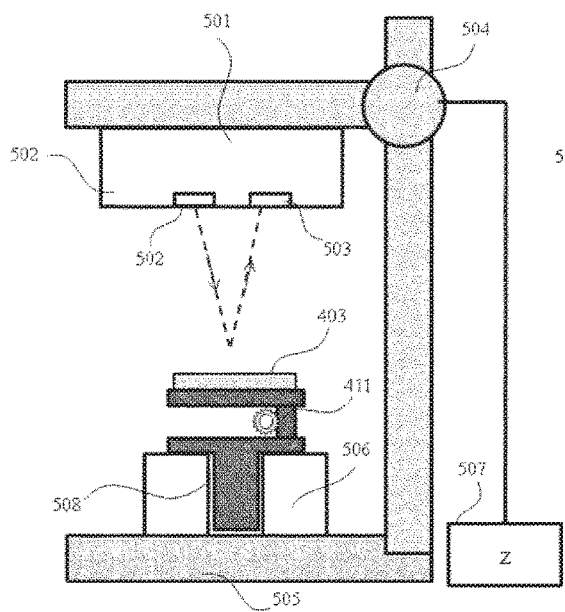
[FIG. 22B]
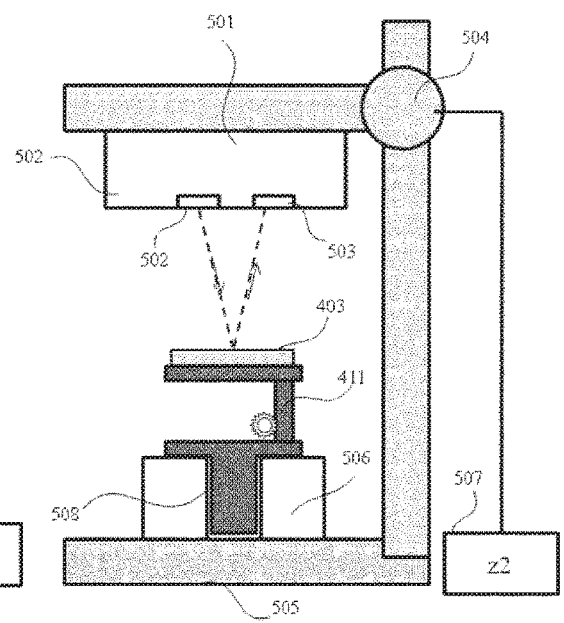

[FIG. 23A] 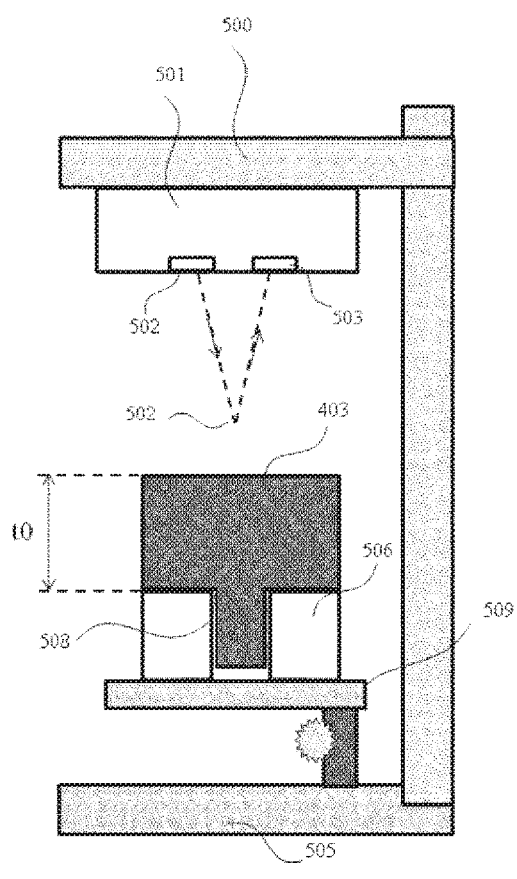
[FIG. 23B] 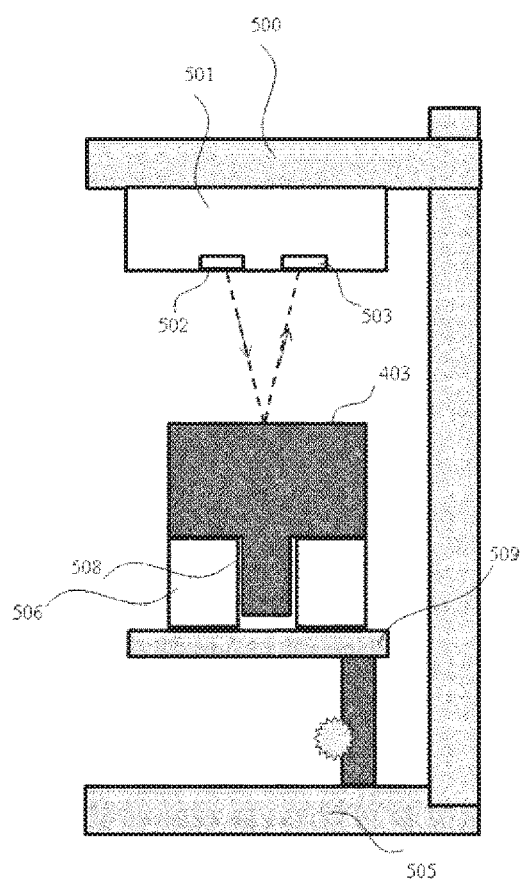

[FIG. 24]
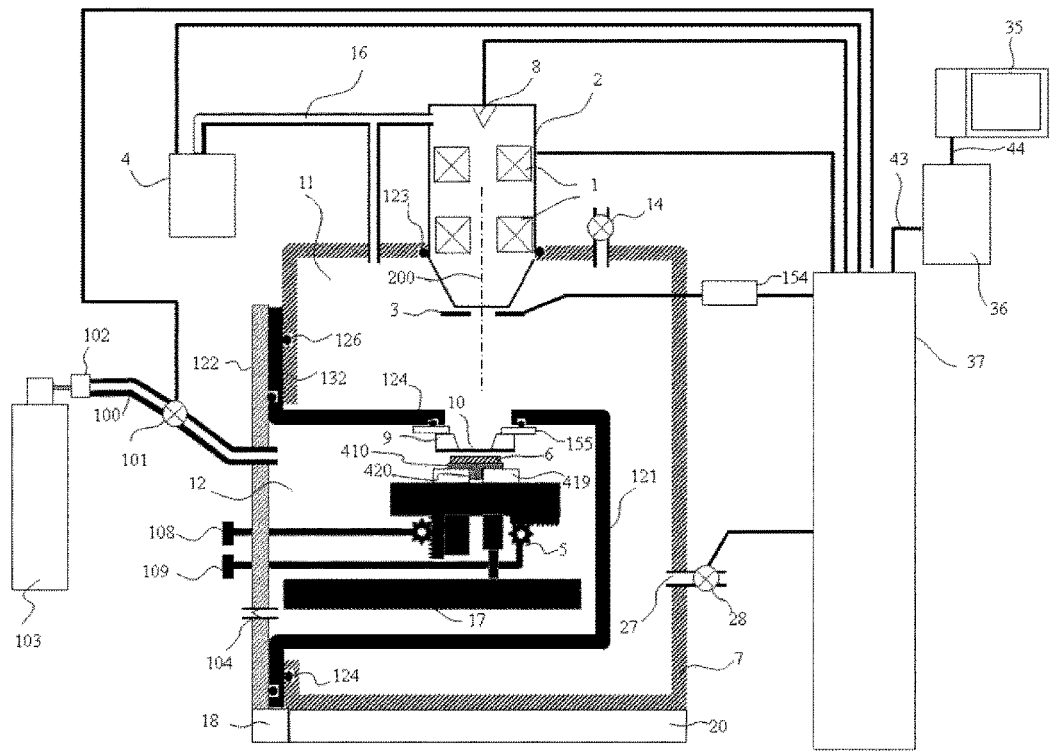
[FIG. 25]
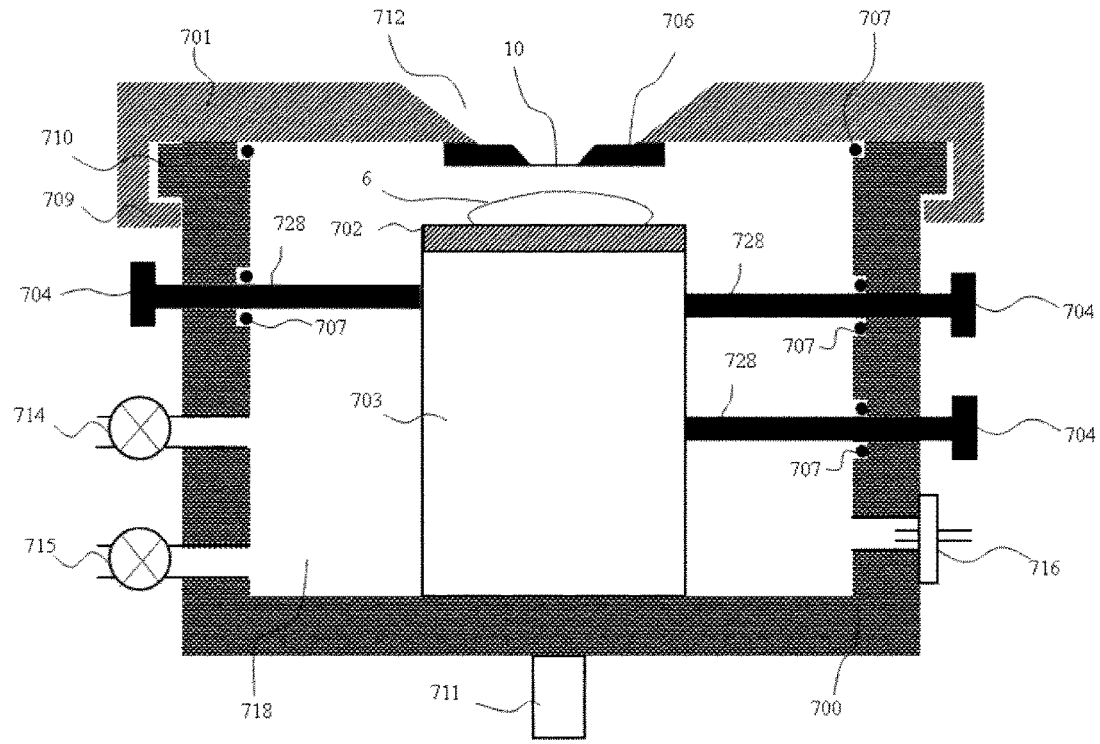

[FIG. 26]
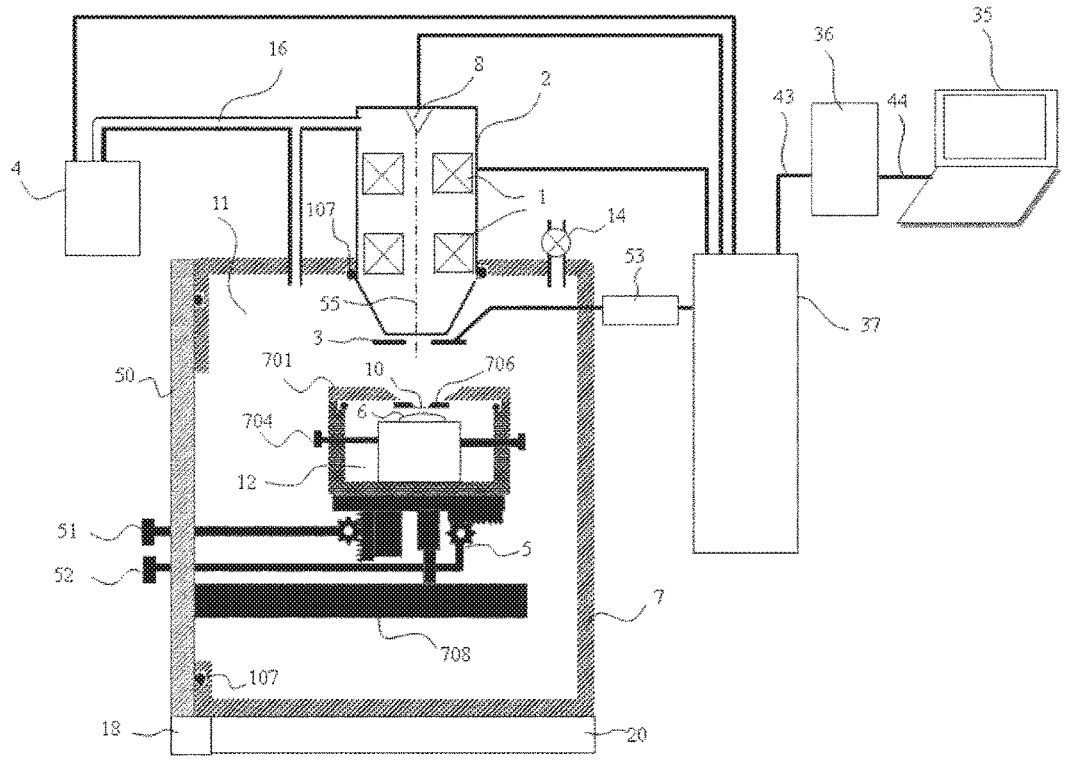
[FIG. 27A]
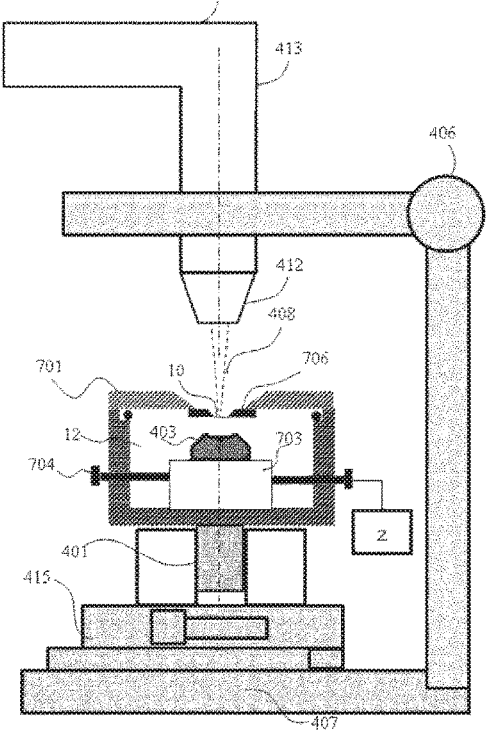
[FIG. 27B]
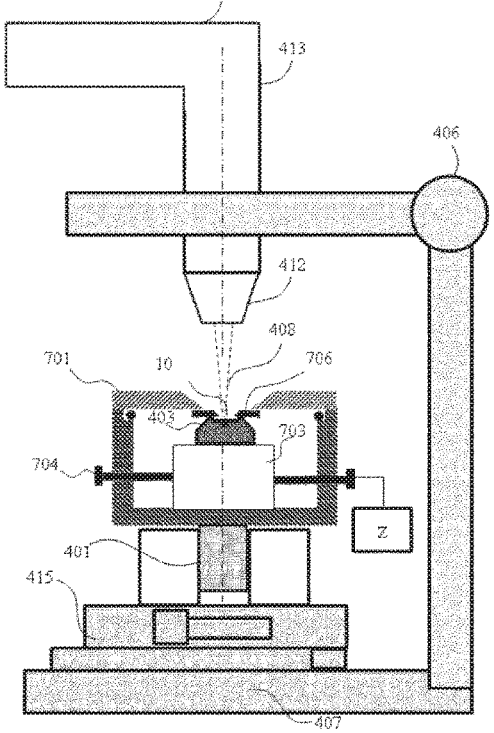

[FIG. 28A]
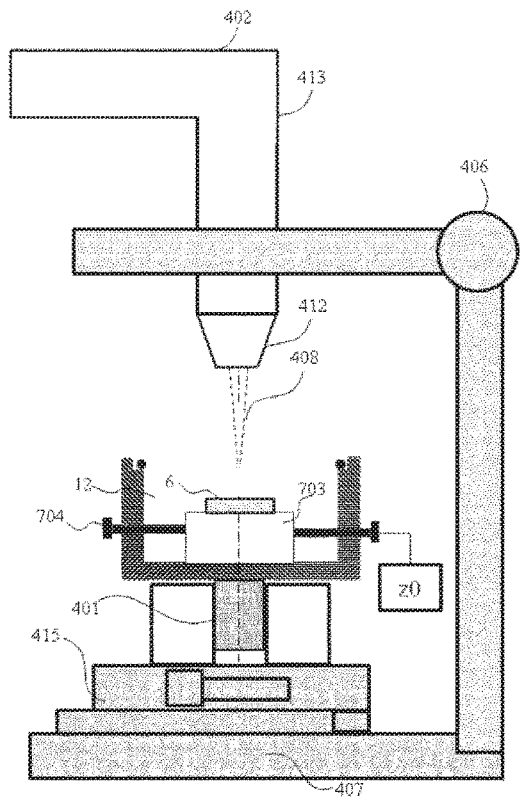
[FIG. 28B]
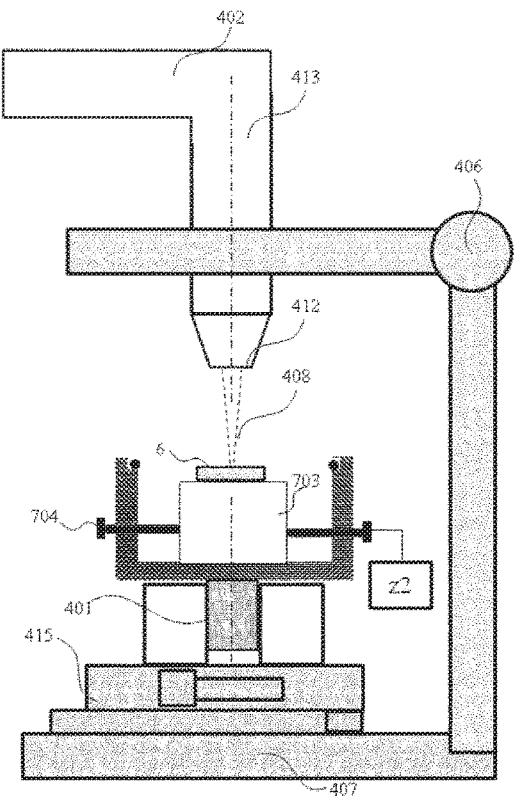

[FIG. 29A]
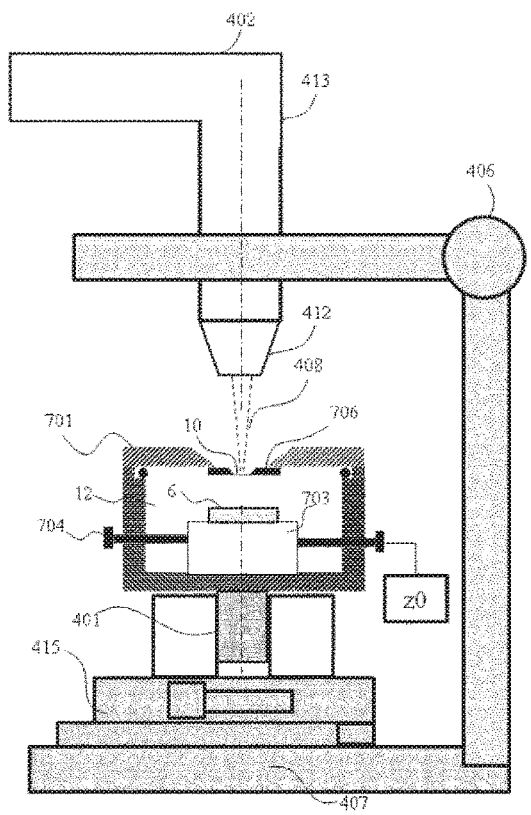
[FIG. 29B]
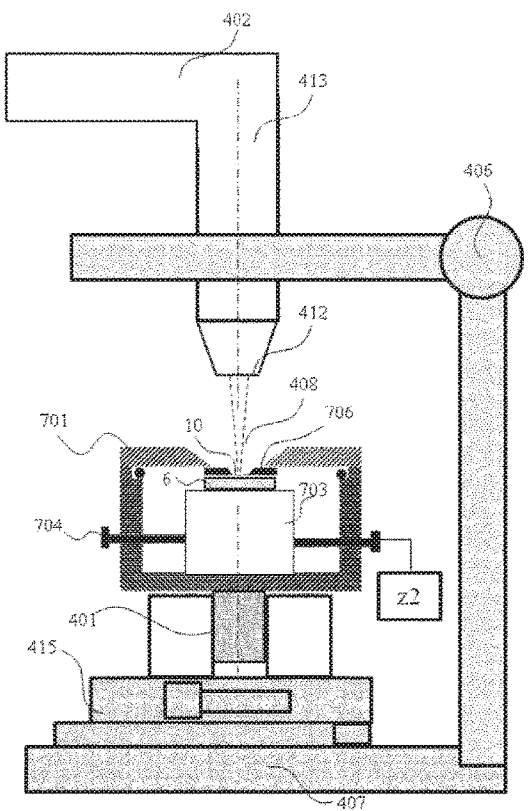

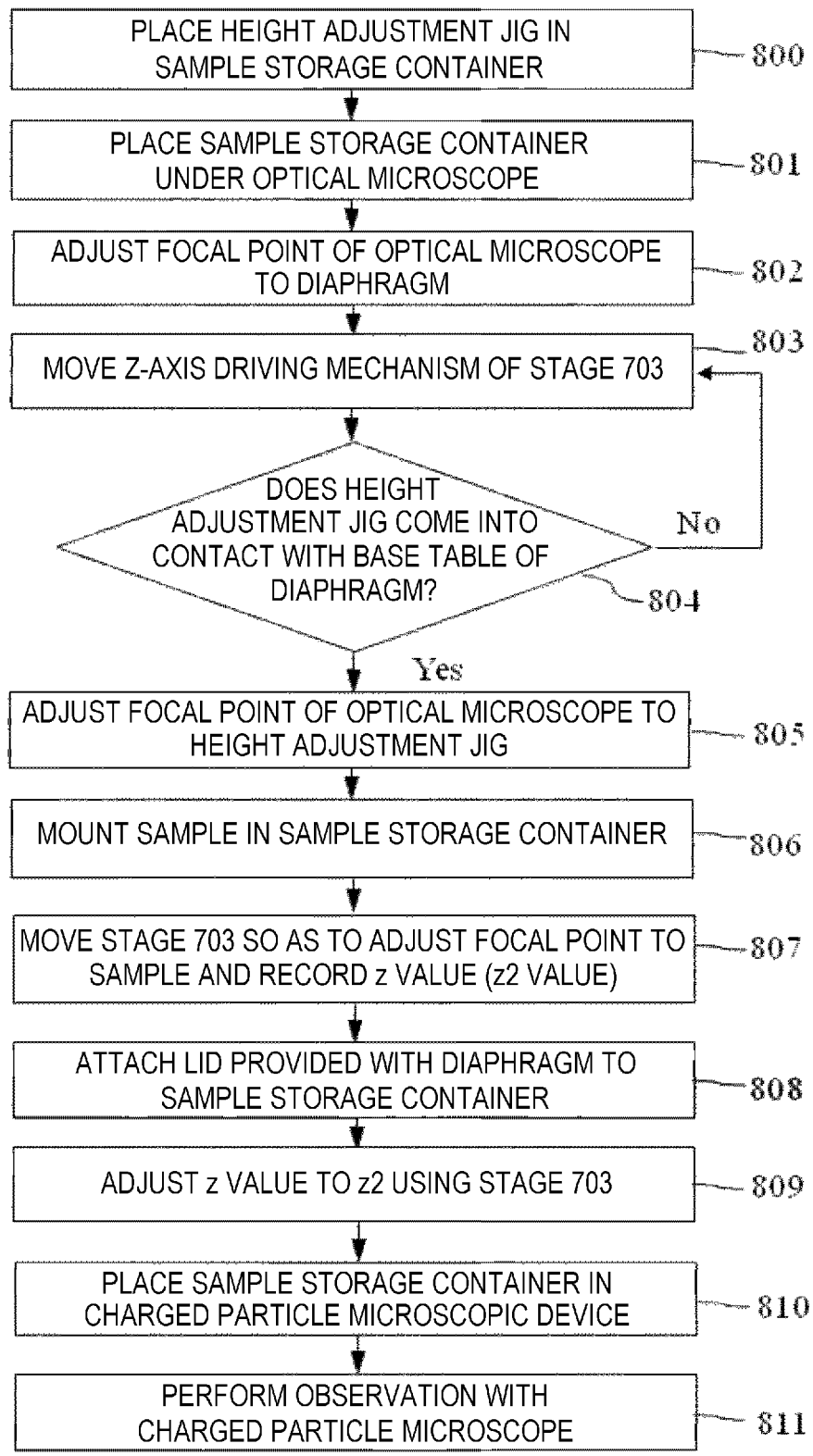
[FIG. 30]

METHOD FOR ADJUSTING HEIGHT OF SAMPLE AND OBSERVATION SYSTEM

TECHNICAL FIELD

The present invention relates to a charged particle beam device capable of observing a sample in an atmospheric pressure, in a desired gas pressure, or in a desired gas species and a method for acquiring an image of a sample using the charged particle beam device.

BACKGROUND ART

In order to observe a microregion of an object, a scanning electron microscope (SEM), a transmission electron microscope (TEM), or the like is used. In general, in such a device, vacuum evacuation of a housing for placing a sample is performed so as to bring a sample atmosphere into a vacuum state, and then, an image of the sample is captured. However, a biochemical sample, a liquid sample, or the like is damaged by the vacuum or the state thereof is changed. On the other hand, the need for observing such a sample with an electron microscope is large, and therefore, an SEM device capable of observing a sample to be observed in an atmospheric pressure, in a desired gas pressure, or in a desired gas species has been strongly demanded.

Therefore, recently, an SEM device capable of placing a sample in an atmospheric pressure, in a desired gas pressure, or in a desired gas species by providing a diaphragm or a micropore which can allow an electron beam to penetrate therethrough between an electron optical system and a sample so as to partition a sample atmosphere and a vacuum in which the electron beam flies has been known. PTL 1 discloses that by using a sample stage provided immediately below a diaphragm, a sample in an atmospheric pressure in a state where the diaphragm and the sample are not in contact with each other is observed with SEM and also the position of the sample is adjusted for the observation.

CITATION LIST

Patent Literature

PTL 1: JP-A-2012-221766 (U.S. Patent Application Publication No. 2014/0021347)

SUMMARY OF INVENTION

Technical Problem

There was a problem that when an atmosphere of the sample to be observed is brought to an atmospheric pressure, a desired gas pressure, or a desired gas species, an electron beam is scattered by the introduced diaphragm, the atmospheric gas, or the introduced gas, and therefore, the microscope image is not clear. For example, in a device in which a sample placed in an atmospheric pressure in a state where a diaphragm and a sample are not in contact with each other is irradiated with a charged particle beam, when a distance between the diaphragm and the sample is long, due to the gas molecule in the atmosphere, the charged particle beam is scattered, resulting in an unclear microscope image. Therefore, it is important to bring the diaphragm and the sample closer to each other so as to reduce the amount scattered by the gas molecule in the atmosphere.

However, if the sample and the diaphragm are excessively brought closer to each other, there is a fear that the diaphragm is damaged due to the contact of the sample with the diaphragm. If the distance between the sample and the diaphragm is known, the damage to the diaphragm can be prevented. Due to this, in PTL 1, a method for monitoring the distance between the sample and the diaphragm using a camera or the like is described. However, when the distance between the diaphragm and the sample is decreased to several hundred micrometers or less, it becomes difficult to perform observation with a camera.

Further, the resolution of the microscope image is greatly affected by the degree of scattering due to the gas molecule in the atmosphere as described above. It is necessary to move the sample stage every time the sample is replaced, and therefore, the distance between the diaphragm and the sample is changed every time. Due to this, it is necessary to fix the distance between the diaphragm and the sample for fixing the dissolution. However, as described above, in the method of PTL 1, the distance between the diaphragm and the sample could not be determined to be fixed in the order of several hundreds of micrometers or less.

In summary, while there was a demand that the distance between the diaphragm and the sample be reduced as much as possible, there was a problem that a limit for how close the diaphragm and the sample can be brought to each other was unknown in the past. In particular, a method for safely reducing the distance between the diaphragm and the sample to several hundreds of micrometers or less was not established. Therefore, it was difficult to safely bring the sample closer to the diaphragm, and also to fix the distance between the diaphragm and the sample for each observation in the past.

The present invention has been made in view of such problems, and an object thereof is to provide a charged particle beam device capable of accurately ascertaining the distance between a diaphragm placed for observing a sample in an air atmosphere or in a gas atmosphere and the sample to be observed, and a method for acquiring an image of a sample using the device.

Solution to Problem

In order to achieve the above object, in a method for adjusting the height of a sample and an observation system of the present invention, the following four steps are performed.

First step: The height of a first sample placement section when a height adjustment member comes into contact with a diaphragm or a base table of the diaphragm by moving the first sample placement section in the optical axis direction of a charged particle optical lens barrel is stored.

Second step: A specific point that indicates a position at a predetermined distance from an optical device uniquely determined for the optical device is adjusted so that the specific point is located on the surface of the height adjustment member by moving at least a part of the optical device to change the distance between the optical device and the height adjustment member.

Third step: A sample table with a Z-axis driving mechanism is placed in the optical device, and the height of the sample table with a Z-axis driving mechanism is adjusted so that the surface of the sample is located at the position of the specific point of the optical device without changing the position of the specific point of the optical device adjusted in the second step.

Fourth step: A distance between the sample and the diaphragm is adjusted by adjusting the height of the first sample placement section of the charged particle beam device or the height of the sample table with a Z-axis driving mechanism using the height of the first sample placement section stored in the first step.

That is, in the method for adjusting the height of a sample and the observation system of the present invention, a height adjustment member is used, and the position of a diaphragm in a charged particle beam device with respect to the height adjustment member is defined as the specific point of an optical device, so that the positional relationship between the height adjustment member and the diaphragm in the optical device is reproduced, and the height of a sample table with a Z-axis driving mechanism is adjusted so as to locate the surface of the sample at the position of the specific point of the optical device.

Advantageous Effects of Invention

According to the present invention, the distance between the diaphragm and the sample can be safely reduced, so that the probability of damage due to the contact of the sample with the diaphragm can be reduced. According to this, the frequency of replacing the diaphragm is reduced, so that the running cost can be suppressed.

Further, since the distance between the diaphragm and the sample can be ascertained, the distance between the diaphragm and the sample can be simply adjusted, and therefore, the distance between the diaphragm and the sample can be reduced as much as possible or can be adjusted so that the distance is fixed every time the sample is replaced. According to this, a clear image can be acquired conveniently.

Objects, configurations, and effects other than those described above will be clarified by the following description of embodiments.

BRIEF DESCRIPTION OF DRAWINGS

FIG. 1 is an overall structural view of a charged particle microscope of a first embodiment.

FIGS. 2A and 2B are explanatory views of an operation when an optical microscope is adjusted using a height adjustment jig in the first embodiment.

FIGS. 3A and 3B are explanatory views of an operation when the height of a sample table with a Z-axis driving mechanism is adjusted using the optical microscope in the first embodiment.

FIGS. 4A and 4B are explanatory views of an operation in which the height adjustment jig is mounted on the charged particle microscope and the scale of the Z-axis driving mechanism is stored in the first embodiment.

FIGS. 5A and 5B are explanatory views of an operation in which the sample table with a Z-axis driving mechanism is placed in the charged particle microscope in the first embodiment.

FIG. 6A is an explanatory view of an operational procedure when a sample stage is used in the first embodiment.

FIG. 6B is an explanatory view of an operational procedure when the sample table with a Z-axis driving mechanism is used in the first embodiment.

FIG. 7 is a view for illustrating a distance between a diaphragm and a sample in the first embodiment.

FIGS. 8A and 8B are explanatory views of an operation when an optical microscope is adjusted using a height adjustment jig in a second embodiment.

FIGS. 9A and 9B are explanatory views of an operation in which the height adjustment jig is mounted on a charged particle microscope and visual adjustment is performed in the second embodiment.

FIGS. 10A and 10B are explanatory views of an operation in which a sample table with a Z-axis driving mechanism is placed in an optical microscope FIG. 10A or in the charged particle microscope FIG. 10B in the second embodiment.

FIGS. 11A and 11B are explanatory views of the shape of a height adjustment jig in a third embodiment.

FIGS. 12A and 12B are explanatory views of an operation in which a height adjustment jig is mounted on a charged particle microscope and the scale of a Z-axis driving mechanism is stored in a fourth embodiment.

FIGS. 13A and 13B are explanatory views of an operation when an optical microscope is adjusted using the height adjustment jig in the fourth embodiment.

FIGS. 14A and 14B are explanatory views of an operation in which a sample table with a Z-axis driving mechanism is placed in the optical microscope FIG. 14A or in the charged particle microscope FIG. 14B in the fourth embodiment.

FIG. 15 is an explanatory view of the shape of the height adjustment jig in the fourth embodiment.

FIG. 16 is an explanatory view when a ring-shaped part is used as the height adjustment jig in the fourth embodiment.

FIGS. 17A and 17B are explanatory views of an operation when a point P is observed in a fifth embodiment.

FIGS. 18A and 18B are explanatory views of an operation when a point Q is observed in the fifth embodiment.

FIGS. 19A and 19B are explanatory views of the shape of the height adjustment jig in a sixth embodiment.

FIG. 20 is an explanatory view of an operational procedure in the sixth embodiment.

FIGS. 21A and 21B are explanatory views of an operation when a laser device is adjusted using a height adjustment jig in a seventh embodiment.

FIGS. 22A and 22B are explanatory views of an operation when the height of a sample table with a Z-axis driving mechanism is adjusted using the laser device in the seventh embodiment.

FIGS. 23A and 23B are explanatory views of a structure in which the laser device is fixed and a sample stage is moved in the seventh embodiment.

FIG. 24 is an overall structural view of a charged particle microscope of an eighth embodiment.

FIG. 25 is a structural view of a sample storage container in a ninth embodiment.

FIG. 26 is a structural view when the sample storage container is placed inside a charged particle microscope in the ninth embodiment.

FIGS. 27A and 27B are explanatory views of an operation in which a stage of the sample storage container is adjusted using an optical microscope in the ninth embodiment.

FIGS. 28A and 28B are explanatory views of an operation in which the position of the stage of the sample storage container is recorded using the optical microscope in the ninth embodiment.

FIGS. 29A and 29B are explanatory views of an operation in which the stage of the sample storage container is adjusted using the optical microscope in the ninth embodiment.

FIG. 30 is an explanatory view of an operational procedure in the ninth embodiment.

DESCRIPTION OF EMBODIMENTS

Hereinafter, the respective embodiments will be described with reference to the drawings.

Hereinafter, a charged particle beam microscope will be described as one example of a charged particle beam device. However, this is merely an example of the present invention, and the present invention is not limited to the following embodiments. The present invention can also be applied to a scanning electron microscope, a scanning ion microscope, a scanning transmission electron microscope, a composite device of a sample processing device and any of these, or an analysis testing device employing any of these.

Further, in this description, the "atmospheric pressure" refers to an air atmosphere or a predetermined gas atmosphere, and means an environment at an atmospheric pressure or a pressure equivalent thereto, and is specifically from about $10^5$ Pa (atmospheric pressure) to about $10^3$ Pa or so.

First Embodiment

In this embodiment, a basic embodiment will be described. FIG. 1 shows an overall structural view of a charged particle microscope of this embodiment. Incidentally, in the following embodiments, a scanning electron microscope is intended and described, however, as described above, the present invention is not limited thereto.

The charged particle microscope shown in FIG. 1 is mainly constituted by a charged particle optical lens barrel 2, a housing (vacuum chamber) 7 which is connected to and supports the charged particle optical lens barrel 2, a sample stage 5 which is placed in an air atmosphere, and a control system which controls these members. When the charged particle microscope is used, vacuum evacuation of the inside of the charged particle optical lens barrel 2 and the housing 7 is performed by a vacuum pump 4. The start and stop operation of the vacuum pump 4 is also controlled by the control system. In the drawing, only one vacuum pump 4 is shown, however, two or more vacuum pumps 4 may be provided. It is assumed that the charged particle optical lens barrel 2 and the housing 7 are supported by a base 270 through pillars (not shown).

The charged particle optical lens barrel 2 is constituted by elements such as a charged particle source 8 which generates a charged particle beam, and an optical lens 1 which converges the generated charged particle beam and guides the charged particle beam to the lower part of the lens barrel, and scans a sample 6 as a primary charged particle beam. From the viewpoint of the service life of the charged particle source or the like, the atmosphere around the charged particle source is generally an atmospheric pressure of $10^{-1}$ Pa or less (hereinafter referred to as "high vacuum"). The charged particle optical lens barrel 2 is placed so as to protrude inside the housing 7 and is fixed to the housing 7 through a vacuum sealing member 123. At an end portion of the charged particle optical lens barrel 2, a detector 3 which detects a secondary charged particle (a secondary electron or a reflected electron) obtained by irradiation with the primary charged particle beam is placed. An image of the sample is acquired based on a signal obtained by the detector 3. The detector 3 may be provided outside or inside the charged particle optical lens barrel 2. The charged particle optical lens barrel may include an additional lens, an electrode, or a detector other than these, or may be partially different from that described above, and the configuration of the charged particle optical system included in the charged particle optical lens barrel is not limited thereto.

The charged particle microscope of this embodiment includes, as the control system, a computer 35 to be used by a device user, an upper-level control section 36 which is connected to and communicates with the computer 35, and a lower-level control section 37 which performs control of the vacuum evacuation system, the charged particle optical system, and the like according to an instruction transmitted from the upper-level control section 36. The computer 35 includes a monitor on which an operation screen (GUI) for the device is displayed, and an input unit for the operation screen such as a keyboard or a mouse. The upper-level control section 36, the lower-level control section 37, and the computer 35 are connected through communication lines 43 and 44.

The lower-level control section 37 is a section which transmits and receives a control signal for controlling the vacuum pump 4, the charged particle source 8, the optical lens 1, and the like, and further converts an output signal of the detector 3 into a digital image signal and transmits the signal to the upper-level control section 36. In the drawing, the output signal from the detector 3 is connected to the lower-level control section 37 through an amplifier 154 such as a pre-amplifier. The amplifier may not be provided if it is not needed.

The upper-level control section 36 and the lower-level control section 37 may mixedly include an analog circuit, a digital circuit, and the like. In addition, the upper-level control section 36 and the lower-level control section 37 may be unified into one section. The charged particle microscope may include an additional control section which controls the operation of each member other than these. The upper-level control section 36 and the lower-level control section 37 may be configured as a hardware by a dedicated circuit board, or may be configured by a software executed in the computer 35. When they are constituted by a hardware, it can be realized by integrating a plurality of calculators which execute processing on a wiring board or in a semiconductor chip or a package. When they are constituted by a software, it can be realized by mounting a general high-speed CPU on a computer and executing a program for executing desired calculation processing. Incidentally, the structure of the control system shown in FIG. 1 is a mere example, and variations of the control unit, the valve, the vacuum pump, the wiring for communication, or the like fall within the scope of the SEM or the charged particle beam device of this embodiment as long as the functions intended by this embodiment are satisfied.

A vacuum pipe 16, one end of which is connected to the vacuum pump 4, is connected to the housing 7, and the inside of the housing 7 can be maintained in a vacuum state. At the same time, the housing 7 has a leak valve 14 for releasing the inside of the housing to the atmosphere, and thus can release the inside of the housing 7 to the atmosphere at the time of maintenance or the like. The leak valve 14 may not be provided, or two or more leak valves may be provided. Further, the placement position of the leak valve 14 on the housing 7 is not limited to the position shown in FIG. 1, and the leak valve 14 may be placed at another position on the housing 7. According to such a configuration, the degree of vacuum of the inside of the housing 7 can be freely adjusted.

On the lower surface of the housing, a diaphragm 10 is provided at a position immediately below the charged particle optical lens barrel 2. This diaphragm 10 can allow a primary charged particle beam emitted from the lower end of the charged particle optical lens barrel 2 to penetrate or pass therethrough, and the primary charged particle beam passes through the diaphragm 10 and reaches the sample 6 mounted on a sample table 410 with a Z-axis driving mechanism in the end. A closed space (that is, the inside of the charged particle optical lens barrel 2 and the housing 7) formed by being separated from a sample mounting space by the diaphragm 10 can be subjected to vacuum evacuation. In this embodiment, the airtight state of the space to be subjected to vacuum evacuation is maintained by the diaphragm 10, and therefore, the charged particle optical lens barrel 2 can be maintained in a vacuum state, and also observation can be performed while maintaining the atmosphere around the sample 6 at an atmospheric pressure. Further, even in a state where a charged particle beam is irradiated, the space where the sample is placed is in an air atmosphere or communicates with a space in an air atmosphere, and therefore, the sample 6 can be freely replaced during observation.

The diaphragm 10 is fixed on the base table 9 by film formation or vapor deposition. The diaphragm 10 is a carbon material, an organic material, a metal material, silicon nitride, silicon carbide, silicon oxide, or the like. The base table 9 is, for example, a member such as a silicon or metal member. The portion of the diaphragm 10 may be in a multi-window form in which a plurality of diaphragms are arranged. The thickness of the diaphragm capable of allowing the primary charged particle beam to penetrate or pass therethrough is from about several nanometers to several micrometers. It is necessary that the diaphragm be not damaged by the pressure difference for separating an atmospheric pressure from vacuum. Due to this, the area of the diaphragm 10 has a size of about several tens of micrometers to several millimeters at the most.

The base table 9 which supports the diaphragm 10 is provided on a diaphragm holding member 155. Although not shown in the drawing, the base table 9 and the diaphragm holding member 155 are assumed to be bonded to each other through an O-ring, a packing, an adhesive, a double-sided adhesive tape, or the like enabling vacuum sealing. The diaphragm holding member 155 is detachably fixed to the housing 7 on the lower surface side through a vacuum sealing member 124. The diaphragm 10 has a thickness of about several nanometers to several micrometers or less and is very thin to meet the demand that the diaphragm allows the charged particle beam to penetrate therethrough, and therefore, there is a possibility that the diaphragm 10 may be damaged due to deterioration over time or during preparation for observation. Further, the diaphragm 10 and the base table 9 which supports the diaphragm 10 are small, and therefore, it is very difficult to directly handle these members. Therefore, as in this embodiment, the diaphragm 10 and the base table 9 are integrated with the diaphragm holding member 155 so as to be able to handle the base table 9 not directly but through the diaphragm holding member 155, and thus, it becomes very easy to handle (particularly replace) the diaphragm 10 and the base table 9. That is, when the diaphragm 10 is damaged, the diaphragm 10 may be replaced along with the diaphragm holding member 155. Even if the diaphragm 10 has to be directly replaced, the diaphragm holding member 155 is taken out to the outside of the device, and the diaphragm 10 can be replaced outside the device along with the base table 9 integrated with the diaphragm 10.

Further, although not shown in the drawing, an optical microscope capable of observing a sample may be placed immediately below or near the sample 6. In this case, the diaphragm 10 is located on the upper side of the sample, and observation is performed from the lower side of the sample with the optical microscope. Due to this, in this case, it is necessary that the sample table 410 with a Z-axis driving mechanism be transparent with respect to light of the optical microscope. As a transparent member, a transparent glass, a transparent plastic, a transparent crystal substance, or the like is used. As a more general sample table, a transparent sample table such as a slide glass (or a preparation) or a dish (or a plate), or the like is used.

Further, a temperature heater, a voltage application section capable of generating an electric field in a sample, or the like may be included. In this case, it is possible to observe a state where the sample is heated or cooled, or a state where an electric field is applied to the sample.

Further, two or more diaphragms may be placed. For example, a diaphragm may be provided inside the charged particle optical lens barrel 2. Alternatively, a second diaphragm is provided on the lower side of a first diaphragm which separates vacuum from air, and a sample may be enclosed between the second diaphragm and the sample stage.

Further, an environmental cell which can be introduced into a vacuum device in a state where the entire sample is enclosed may be used as the sample. For example, also in the case where a sample height adjustment mechanism is provided inside an environmental cell, and a sample is brought closer to the diaphragm for separating vacuum from air, the below-mentioned present invention can be applied. Details will be described later in a ninth embodiment. In the present invention, regardless of the number or types of diaphragms, the device falls within the scope of the SEM or the charged particle beam device of this embodiment as long as the functions intended by this embodiment are satisfied.

In the following description, the "sample stage" refers to a placement section of the sample table fixed to the device body of the charged particle microscope or the optical microscope. The sample stage 5 of the charged particle microscope has at least a Z-axis driving mechanism for driving the sample stage in the Z-axis direction. The Z-axis direction refers to a direction along (parallel to) a charged particle beam optical axis 200. This Z-axis driving mechanism is a mechanism to be used for arbitrarily adjusting the distance between the sample and the diaphragm, and may be, for example, a manually operated fine adjustment screw or a motor. The Z-axis driving mechanism is configured to be able to numerically express the driving amount in the Z-axis direction in a scale by, for example, the memory of a screw, the number of steps of a motor, or the like.

Further, the sample stage 5 of the charged particle microscope includes a sample placement section 419 for placing a height adjustment jig 403 and the sample table 410 with a Z-axis driving mechanism in this embodiment. In the following description, the sample table refers to a member, which can be attachable to and detachable from the sample stage, and on which a sample is directly or indirectly placed. By configuring the sample table to be attachable to and detachable from the sample stage, the sample table can be moved with a sample mounted thereon between the device and another device such as an optical microscope. As shown in the following embodiments, when the sample table is attached to and detached from the sample stage 5, it is desirable to be able to easily adjust a desired observation position to the same position (that is, on the charged particle beam optical axis 200) every time. Therefore, the sample placement section 419 has a positioning structure 420 for fitting the height adjustment jig 403 and the sample table 410 with a Z-axis driving mechanism. This positioning structure 420 can maintain the central axis of the sample placement section 419 and the central axis of the height adjustment jig 403 and the sample table 410 with a Z-axis driving mechanism in a given positional relationship when the height adjustment jig 403 and the sample table 410 with a Z-axis driving mechanism are fitted. Hereinafter, a description will be given using a configuration in which the positioning structure 420 provided for the sample placement section 419 is defined as a hole, and a protrusion is provided for the height adjustment jig 403 and the sample table 410 with a Z-axis driving mechanism. A description will be given by assuming that the size and shape (or diameter) of the hole of the positioning structure 420 provided for the sample placement section 419 and the size and diameter (or diameter) of the protrusion of the height adjustment jig 403 and the sample table 410 with a Z-axis driving mechanism are substantially equal or the former is slightly larger than the latter. According to this, the positional relationship between the axis of the hole of the positioning structure 420 and the axis of the protrusion of the height adjustment jig 403 and the sample table 410 with a Z-axis driving mechanism can always be made the same. However, the relationship between the hole and the protrusion may be reversed, or other structures such as a groove and a protrusion may be used.

Further, the sample stage 5 of the charged particle microscope may have an XY-plane moving mechanism for driving the sample stage within an XY-plane. The XY-plane refers to a plane perpendicular to the above-mentioned Z-axis. This XY-plane moving mechanism is a mechanism to be used for observing an arbitrary region on the sample stage 5. According to this, an arbitrary region to be observed is searched on the sample and can be moved to the center of the field of view.

In a charged particle microscope capable of performing observation in an atmospheric pressure, it is necessary to adjust a distance between a diaphragm and a region to be observed of a sample to about several hundreds to several tens of micrometers in order to suppress scattering of a charged particle beam as much as possible and also to prevent damage to the diaphragm due to contact with the sample. This operation is very delicate, and the convenience of the charged particle microscope with which observation is performed in an atmospheric pressure is greatly impaired.

In view of the above problem, in this embodiment, an example in which the convenience of a charged particle microscope capable of performing observation in an atmospheric pressure environment is improved by utilizing a microscope of an optical system (hereinafter, optical microscope) or the like for adjustment of the height of a sample and the Z-axis coordinate of the sample when performing observation with the charged particle microscope will be described. Hereinafter, the configuration of the device and how to use the device will be described.

As described in the following embodiments, the height of a sample and the Z-axis coordinate of the sample when performing observation with the charged particle microscope are previously determined using an optical microscope and the below-mentioned height adjustment jig and sample table with a Z-axis driving mechanism. When the sample is actually observed with the charged particle microscope, it is only necessary to place the sample at the previously determined height and Z-axis coordinate of the sample, and a delicate operation of sample height adjustment and Z-axis coordinate adjustment is no longer needed. According to this, adjustment of the height of a sample and adjustment of the Z-axis coordinate of the sample, for which a delicate operation was needed in the past, can be performed simply, and the convenience of the device can be greatly improved.

A method for indirectly ascertaining the distance and the positional relationship between the diaphragm and a sample in the charged particle microscope by the optical microscope 402, the height adjustment jig 403, and the sample table 410 with a Z-axis driving mechanism will be described with reference to FIG. 2 and FIG. 3. Here, the optical microscope refers to a microscope provided with an optical lens, however, it also includes a device or the like capable of performing observation at a lower magnification than the charged particle microscope in an atmospheric pressure environment using a high-powered camera or the like. Alternatively, it may be an optical laser distance measurement device capable of ascertaining a distance by irradiating a laser and acquiring a reflected signal of the laser. It may be any device as long as it is an optical device capable of ascertaining the position of the sample without coming into physical contact with the sample, and therefore can also be called simply "optical observation device" or "optical device". The optical device in this embodiment has a specific point uniquely determined for the optical device. This specific point indicates a position at a predetermined distance from the optical device, and in the case where the optical device is an optical microscope, the specific point corresponds to a focal point, and in the case where the optical device is an optical laser distance measurement device, the specific point corresponds to the measurement reference point of the optical laser distance measurement device.

Hereinafter, as one example of the optical device, a configuration using an optical microscope will be described below.

FIG. 2 is an explanatory view of an operation when a height adjustment jig is placed in an optical microscope, and the optical microscope is adjusted using the height adjustment jig.

The optical microscope 402 includes an objective lens 412, a lens barrel 413, an optical microscope position driving mechanism 406 for moving these members in the above-mentioned Z-axis direction, and a base table 407 which supports the optical microscope 402 with respect to a device placement surface and is provided with the optical microscope position driving mechanism 406. Incidentally, the optical axis direction of the optical microscope 402 coincides with the Z-axis direction. That is, placement is performed so that the optical axis of the optical microscope 402 is parallel to the optical axis (Z-axis) of the charged particle microscope. The optical microscope position driving mechanism 406 is a mechanism to be used for adjusting the focal point to a region to be observed of the sample, and is a moving mechanism capable of mechanically moving at least apart of the optical microscope in the optical axis direction. The focal point position 408 of the optical microscope 402 is indicated by the intersection of dotted lines in the drawing. Incidentally, here, a description will be given using a configuration in which the objective lens 412 or the lens barrel 413 itself drives in the Z-axis direction so as to adjust the distance from the sample, however, a configuration in which the objective lens 412 and the lens barrel 413 are fixed, and a sample stage (not shown) is provided on the base table 407, and the sample stage drives in the Z-axis direction so as to adjust the distance from the sample (or a sample placement section 400) may be adopted.

The optical microscope 402 includes the sample placement section 400. This sample placement section 400 has a positioning structure for fitting the height adjustment jig 403 and the sample table 410 with a Z-axis driving mechanism in the same manner as being provided for the sample stage 5 of the charged particle microscope.

Further, the height adjustment jig 403 has a structure capable of fitting to a positioning structure 401 of the sample placement section 400 described above. That is, the positioning structure 401 included in the optical microscope 402 has the same shape as that of the positioning structure 420 of the sample stage of the charged particle microscope. According to this, the height adjustment jig 403 can be used in common. Further, in a state where the height adjustment jig is placed in the sample placement section 400, the height adjustment jig has an upper face (a plane or a face having a cavity described below) larger than the window frame of the diaphragm as a face facing the diaphragm, and the distance between the upper surface of the sample placement section 400 and the upper surface of the height adjustment jig is t0 and is constant. Hereinafter, the distance between the upper surface of the sample placement section 400 and the upper surface of the height adjustment jig 403 in a state where the height adjustment jig 403 is placed on the sample placement section 400 is referred to as "the height of the height adjustment jig 403". The distance to the upper surface of the height adjustment jig 403 from each sample placement section in the case where the height adjustment jig 403 is placed on the sample placement section 419 or the below-mentioned sample placement section 506 is also referred to as "the height of the height adjustment jig 403" in the same manner. Further, the upper surface of the height adjustment jig 403 is assumed to be a sufficiently flat face.

FIG. 3 is an explanatory view when the sample table 410 with a Z-axis driving mechanism is placed in the optical microscope and the height of the sample table with a Z-axis driving mechanism is adjusted using the optical microscope. The sample table 410 with a Z-axis driving mechanism includes a sample mounting section 409 for mounting the sample 6. The sample mounting section 409 may be attachable to and detachable from the sample table 410 with a Z-axis driving mechanism. Further, the sample table 410 with a Z-axis driving mechanism itself has a Z-axis driving mechanism 411 for driving in the Z-axis (optical axis) direction independently of the sample stage of the optical microscope and the charged particle microscope. According to this, the distance from the upper surface of the sample placement section 400 to the region to be observed of the sample 6 on the sample table 410 with a Z-axis driving mechanism, that is, the height of the sample 6 can be arbitrarily adjusted. Hereinafter, the "height of the sample" refers to the distance from the upper surface (a face facing the objective lens of the optical microscope) of the sample placement section 400 to the surface of the sample on the sample table 410 with a Z-axis driving mechanism. Further, the sample table 410 with a Z-axis driving mechanism has a structure capable of fitting to the positioning structure of the sample placement section 400 described above. As described above, the positioning structure 401 included in the optical microscope 402 has the same shape as that of the positioning structure 420 of the sample stage of the charged particle microscope, and therefore, the sample table 410 with a Z-axis driving mechanism can be used in common in the charged particle beam device and in the optical microscope.

In FIG. 2(a), a state where the height adjustment jig 403 is placed on the sample placement section 400 of the optical microscope 402 is shown. The optical microscope position driving mechanism 406 in this state is moved, and the focal point position 408 of the optical microscope 402 is adjusted to the surface of the height adjustment jig 403. This state is shown in FIG. 2(b).

In FIG. 3(a), a state where the sample table 410 with a Z-axis driving mechanism having the sample 6 mounted thereon is placed in the optical microscope 402 is shown. The focal point of the optical microscope 402 can be adjusted to the surface of the sample by moving the Z-axis driving mechanism 411 of the sample table 410 with a Z-axis driving mechanism in this state. At this time, the Z-axis driving mechanism 411 moves independently, and therefore, while fixing the optical microscope position driving mechanism 406, the focal point of the optical microscope can be adjusted to the surface of the sample. In FIG. 3(b), a state where the focal point 408 of the optical microscope 402 is adjusted to the surface of the sample 6 on the sample table 410 with a Z-axis driving mechanism is shown.

In FIG. 4(a), a state where the height adjustment jig 403 is placed in the charged particle microscope in FIG. 1 is shown. The height adjustment jig 403 can be brought closer to the diaphragm 10 by moving a Z-axis driving mechanism 414 of the sample stage 5 in this state.

In FIG. 4(b), a state where the height adjustment jig 403 is brought into contact with the base table 9 of the diaphragm 10 is shown. When the device is in this state, the position at which the height adjustment jig 403 comes into contact with the base table 9 of the diaphragm 10 is known from the scale of the Z-axis driving mechanism (z0 in FIG. 4(b)).

Incidentally, the diaphragm 10 is very thin in order to allow a charged particle beam to pass therethrough, and also a region on the upper side of the diaphragm 10 in the drawing is in a vacuum state, and a region on the lower side of the diaphragm 10 is in an atmospheric pressure state, and therefore, the diaphragm 10 is in a state of being recessed upward. Further, as described above, the upper surface of the height adjustment jig 403 is sufficiently flat. Due to this, even if the height adjustment jig 403 is brought closer to or into contact with the base table 9 of the diaphragm 10, there is little probability that the diaphragm 10 is damaged.

In FIG. 5(a), a state where the sample table 410 with a Z-axis driving mechanism having the sample 6 mounted thereon is placed in the charged particle microscope in FIG. 1 is shown. The sample table 410 with a Z-axis driving mechanism and the sample 6 can be brought closer to the diaphragm 10 by moving the Z-axis driving mechanism 414 of the sample stage 5 in this state. In FIG. 5(b), a state where the sample table 410 with a Z-axis driving mechanism and the sample 6 are brought closer to the diaphragm 10 is shown.

One of the patterns of the operational procedure for adjusting the height of a sample in order to safely bring the sample 6 closer to the diaphragm 10 using the above-mentioned device and technique of the present invention will be described with reference to FIG. 6(a).

First, a phase A is performed as a first procedure. In the phase A, an operation in which the position in the Z-axis direction of the diaphragm in the charged particle microscope is confirmed using the height adjustment jig is performed. More specifically, the position of the sample stage when the height adjustment jig comes into contact with the base table 9 of the diaphragm 10 by moving the sample placement section 419 in the optical axis direction of the charged particle optical lens barrel 2 by the sample stage of the charged particle microscope is stored.

First, as shown in FIG. 4(a), the height adjustment jig 403 is placed on the sample placement section 419 of the charged particle microscope (Step 601). Then, as shown in FIG. 4(b), the sample placement section 419 is brought closer to the diaphragm by moving the Z-axis driving mechanism 414 of the sample stage 5 until the height adjustment jig 403 comes into contact with the base table 9 of the diaphragm 10 (Steps 602 and 603). It is found on an image acquired by the charged particle microscope that when the height adjustment jig 403 and the base table 9 come into contact with each other, the base table 9 slightly moves to any of the left, right, top, and bottom, and therefore, it is possible to determine whether these members come into contact with each other by observing the base table 9 of the diaphragm 10 with the charged particle microscope. Incidentally, the determination as to whether these members come into contact with each other may be performed by confirming electrical conduction. When these members come into contact with each other, the approach of the height adjustment jig is stopped (Step 604). The position in the Z-axis direction of the sample stage in a state where the height adjustment jig 403 and the base table 9 of the diaphragm 10 come into contact with each other is stored. More specifically, the value of the scale of the Z-axis driving mechanism 414 in this state is stored (Step 605). The value may be stored manually, or may be stored in the hard disk of a computer connected to the charged particle microscope or in a storage medium such as a memory. Further, a series of procedures of Steps 602 to 605 are programmed and so on and may be automatically performed. The value of the scale of the Z-axis driving mechanism 414 in this state is defined as z0. Thereafter, the height adjustment jig 403 is detached from the sample placement section 419 of the charged particle microscope (Step 606).

Subsequently, a phase B is performed as a second procedure. In the phase B, an operation in which the height of the optical microscope is adjusted by the height adjustment jig 403 used in the phase A is performed. More specifically, the adjustment is performed by changing the distance between the optical microscope and the height adjustment jig by driving the optical microscope in the Z-axis direction, so that the focal point of the optical microscope is adjusted to the surface of the height adjustment jig 403.

In the phase B, the height of the optical microscope is adjusted using the height adjustment jig 403. First, as shown in FIG. 2(*a*), the height adjustment jig 403 is placed on the sample placement section 400 of the optical microscope 402 (Step 607). Observation with the optical microscope is started, the optical microscope position driving mechanism 406 is moved, and the focal point is adjusted to the surface of the height adjustment jig 403 (Step 608). In FIG. 2(*b*), a state where the focal point is adjusted to the surface of the height adjustment jig 403 is shown. Thereafter, the height adjustment jig 403 is detached from the sample placement section 400 of the optical microscope 402 without moving the optical microscope position driving mechanism 406 in the state in FIG. 2(*b*) (Step 609).

Subsequently, a phase C is performed as a third procedure. In the phase C, the height of the sample table with a Z-axis driving mechanism having the sample mounted thereon is adjusted using the optical microscope in a state of being adjusted in the phase B. More specifically, the sample table 410 with a Z-axis driving mechanism is placed on the sample placement section 400 of the optical microscope, and the adjustment is performed by the Z-axis driving mechanism 411 of the sample table 410 with a Z-axis driving mechanism so that the surface of the sample is located at the position of the focal point without changing the position of the focal point of the optical microscope adjusted in the phase B.

In the phase C, first, as shown in FIG. 3(*a*), the sample table 410 with a Z-axis driving mechanism having the sample 6 mounted thereon is placed on the sample placement section 400 of the optical microscope 402 (Step 610). Subsequently, while performing observation with the optical microscope 402, the Z-axis driving mechanism 411 of the sample table 410 with a Z-axis driving mechanism is moved so that the focal point 408 of the optical microscope 402 is adjusted to the sample 6 (Step 611). Here, it is important to maintain the state adjusted in the phase B without moving the optical microscope position driving mechanism 406. It can be confirmed whether the position of the sample is adjusted to the focal point 408 from an image of the optical microscope 402 (Step 612). FIG. 3(*b*) shows a state where the focal point 408 of the optical microscope 402 is adjusted to the sample 6. When the sample is located at the focal point 408, the operation of the Z-axis driving mechanism 411 is stopped (Step 613). The height of the sample at this time coincides with the distance t0 between the upper surface of the sample placement section 400 and the upper surface of the height adjustment jig 403 when the height adjustment jig 403 is placed on the sample placement section 400. Thereafter, the sample table 410 with a Z-axis driving mechanism having the sample 6 mounted thereon is detached from the sample placement section 400 of the optical microscope 402 (Step 614). At this time, the sample table 410 is detached without moving the Z-axis driving mechanism 411 in the state of Step 613.

In a fourth procedure, a phase D is performed. In the phase D, the Z-axis coordinate of the sample 6 in the charged particle microscope is adjusted. More specifically, the distance between the sample and the diaphragm is adjusted by adjusting the position of the sample stage of the charged particle microscope using the height of the sample placement section in the charged particle microscope stored in the phase A.

First, the sample table 410 with a Z-axis driving mechanism having the sample 6 mounted thereon is placed on the sample placement section 419 of the charged particle microscope (Step 615). This state is shown in FIG. 5(*a*). Here, it is important that the Z-axis driving mechanism 411 adjusted in the phase C is not moved. Thereafter, when the scale of the Z-axis driving mechanism 414 of the sample stage 5 is adjusted to z0-z1 which is a position whose height in the Z-axis direction is lower (that is, further away from the diaphragm 10) than z0, and then, observation is started, the sample can be observed (FIG. 5(*b*)). Incidentally, z1 is, for example, several tens to one hundred micrometers and so on, and may be determined according to the degree of scattering due to a gas present between the sample and the diaphragm.

As described above, the height t0 of the sample can be indirectly ascertained through the height adjustment jig 403 in the optical microscope disposed outside the charged particle microscope device. In other words, in this embodiment, in the phase B and the phase C, the height adjustment jig 403 and the height of the sample on the sample table 410 with a Z-axis driving mechanism are made to coincide with t0 by utilizing the position of the focal point of the optical microscope. According to this, the position of the diaphragm 10 in the Z-axis driving mechanism 414 of the sample stage 5 measured with the height adjustment jig 403 can be used also when the sample table 410 with a Z-axis driving mechanism having the sample mounted thereon is placed on the sample stage 5. In another expression, in this embodiment, by allowing the height adjustment jig 403 and the height of the sample on the sample table 410 with a Z-axis driving mechanism to coincide with each other, the height adjustment jig 403 placed in the charged particle microscope in the phase A is spuriously regarded as the sample table 410 with a Z-axis driving mechanism. According to this, by utilizing the height adjustment jig in place of the sample table, which is actually not allowed to come into contact with the diaphragm, and bringing the height adjustment jig into contact with the base table of the diaphragm, the position of the diaphragm can be ascertained.

Further, in the above description, the configuration in which the operation is performed in the order of "the phase A→the phase B→the phase C→the phase D" is described, however, other than this, the operation may be performed in the order in the following three patterns. The alphabets in the following (1) to (3) indicate the phase names.
(1) B→A→C→D
(2) B→C→A→D
(3) B→(A and C are performed at the same time)→D In other words, the phase C may be performed after the phase B, and also the phase D may be performed after all the phases A to C are performed.

In the phase D, the distance between the sample and the diaphragm is adjusted by adjusting the position of the sample stage of the charged particle microscope, however, the distance between the sample and the diaphragm may be adjusted by adjusting the height of the sample table with a Z-axis driving mechanism. One of the patterns of the operational procedure for adjusting the height of the sample in this case will be described with reference to FIG. 6(b).

In the same manner as in FIG. 6(a), the phase A as the first procedure and the phase B as the second procedure are performed.

Subsequently, a phase E is performed as the third procedure. In the phase E, after the height of the sample table with a Z-axis driving mechanism is adjusted in the same manner as in the phase C, the height of the sample table with a Z-axis driving mechanism is lowered by z1 from t0. That is, the height of the sample table with a Z-axis driving mechanism is adjusted so that the surface of the sample is lowered by z1 from the position of the focal point of the optical microscope.

In the phase E, first, Steps 620 to 624 which are exactly the same as Steps 610 to 613 in the phase C are performed. When Step 624 is performed, the height of the sample is t0. Subsequently, the Z-axis driving mechanism of the sample table with a Z-axis driving mechanism is moved so that the height of the sample is lowered by z1 from t0 (Step 625). At this time, the height of the sample is t0-z1. Thereafter, the sample table 410 with a Z-axis driving mechanism having the sample 6 mounted thereon is detached from the sample placement section 400 of the optical microscope 402 (Step 626). Step 626 is the same as Step 614.

Subsequently, a phase F is performed as the fourth procedure. In the phase F, in the same manner as the phase D, the Z-axis coordinate of the sample 6 in the charged particle microscope is adjusted.

First, the sample table 410 with a Z-axis driving mechanism having the sample 6 mounted thereon is placed on the sample placement section 419 of the charged particle microscope (Step 627). Here, it is important that the Z-axis driving mechanism 411 adjusted in the phase E is not moved. Thereafter, when the scale of the Z-axis driving mechanism 414 of the sample stage 5 is adjusted to z0 (Step 628) and observation is started, the sample can be observed (Step 629). This state is shown in FIG. 7.

As described above, it is also possible to ascertain the position of the diaphragm by setting the height of the sample to t0-z1 by adjusting the height of the sample table with a Z-axis driving mechanism.

In the above description, the configuration in which the operation is performed in the order of "the phase A the phase B→the phase E→the phase F" is described, however, other than this, the operation may be performed in the order in the following three patterns. The alphabets in the following (1) to (3) indicate the phase names.
(1) B→A→E→F
(2) B→E→A→F
(3) B→(A and E are performed at the same time)→F In other words, the phase E may be performed after the phase B, and also the phase F may be performed after all the phases A, B and E are performed.

According to this embodiment as described above, by previously determining the height of the sample 6 and the Z-axis coordinate of the sample 6 when performing observation with the charged particle microscope utilizing the optical microscope 402 and the height adjustment jig 403, the sample 6 can be observed with the charged particle microscope in an atmospheric pressure environment without performing a delicate operation of adjustment of the height of the sample 6 and the Z-axis coordinate. According to this, a risk of damage to the diaphragm is reduced, and also it becomes easy to ascertain and control the distance between the diaphragm and the sample, and thus, the convenience of the charged particle microscope capable of performing observation in an atmospheric pressure environment is improved.

Further, according to this embodiment, the position where the sample comes into contact with the diaphragm during observation of the sample can be known in advance. That is, in the case where the sample stage is moved during observation, when the position of the sample stage is raised higher than z0 (comes closer to the diaphragm 10), the sample may come into contact with the diaphragm. Therefore, the moving range of the sample stage may be limited so that the sample stage is not raised higher than z0 (does not come closer to the diaphragm 10) at a stage when the position of z0 is measured by the height adjustment jig 403.

Second Embodiment

Next, a case where a target object 416 is provided on the surface of the height adjustment jig 403 will be described. In the above-mentioned example, there is a problem that the position in the XY direction of the field of view when performing observation with the optical microscope 402 and the position in the XY direction of the field of view when performing observation with the charged particle microscope do not coincide with each other. Therefore, a method in which a moving mechanism is provided for the optical microscope 402, and the center of the field of view of the optical microscope 402 and the center of the field of view of the charged particle microscope are made to coincide with each other, and then, a specific region on a sample is observed will be described. In this example, the height adjustment jig 403 with the target object 416 when performing observation with the optical microscope 402 and the charged particle microscope, the optical microscope 402 with an XY-plane moving mechanism 415, and the charged particle microscope with an XY-plane moving mechanism 417 are used. In FIG. 8, FIG. 9, and FIG. 10, necessary structures and states where these structures are combined are shown. Hereinbelow, a description of the same parts as those of the above-mentioned embodiment will be omitted.

The height adjustment jig 403 of this embodiment has the target object 416 when performing observation with the optical microscope 402 and the charged particle microscope on the surface. This target object is used for making the center of the field of view when the height adjustment jig 403 is observed with the optical microscope 402 and the center of the field of view when the height adjustment jig is observed with the charged particle microscope coincide with each other. This target object 416 is a material which has a shape such that it does not protrude from the surface of the height adjustment jig 403 and has a size capable of being observed with both of the optical microscope 402 and the charged particle microscope such as a groove, a hole, or a specific material-embedded structure. However, two or more target objects 416 may be provided (such as concentric circles having different sizes) as long as the coordinate on the XY-plane of the center of the field of view at the time of observation can be uniquely determined, and the shape thereof does not matter. Further, the target object 416 is sometimes called "target structure" or "target mark". Incidentally, here, a description will be given using a structure in which the target object is placed on the central axis of the height adjustment jig 403, however, a position where the target object 416 is placed may not coincide with the central axis as long as it is on the surface.

In this embodiment, each of the optical microscope 402 and the charged particle microscope has an XY-plane moving mechanism. This XY-plane moving mechanism is a mechanism for moving the sample or the height adjustment jig in the direction in the XY-plane, and may be constituted by, for example, a fine adjustment screw or a motor. The XY-plane moving mechanism is used for observing an arbitrary region on the sample stage.

FIG. 8 shows a state where the height adjustment jig is placed in the optical microscope and corresponds to Steps 607 to 609 in FIG. 6. FIG. 8(*a*) shows a state immediately after the above-mentioned height adjustment jig 403 is placed in the optical microscope 402 (Step 607). The optical microscope 402 of this embodiment has the XY-plane moving mechanism 415. The XY-plane moving mechanism 415 of the optical microscope 402 is provided, for example, on the base table 407 and below the sample placement section 400, and is a mechanism capable of moving the sample or the height adjustment jig 403 placed on the sample placement section 400 in the XY-plane direction. According to this, an arbitrary region to be observed on the sample is searched and can be moved to the center of the field of view of the optical microscope 402. Incidentally, here, a description will be given using a configuration in which the base table 407 of the optical microscope 402 includes the XY-plane moving mechanism 415, however, a configuration in which the base table 407 is fixed, and an XY-plane moving mechanism for moving the lens barrel 413 and the objective lens 412 is included may be adopted.

By moving the XY-plane moving mechanism 415 of the optical microscope 402 in this state while performing observation with the optical microscope 402, the target object 416 on the surface of the height adjustment jig 403 can be moved to the center of the field of view of the optical microscope 402. In FIG. 8(*b*), a state where the target object 416 on the surface of the height adjustment jig 403 is present in the field of view (preferably in the center of the field of view) of the optical microscope 402 is shown. In this embodiment, in a step corresponding to Step 608 in FIG. 6, in addition to the adjustment of the focal point to the height adjustment jig 403 by moving the optical microscope position driving mechanism 406, adjustment is performed so that the target object 416 of the height adjustment jig 403 is placed in the field of view of the optical microscope 402 by the XY-plane moving mechanism 415.

FIG. 9 shows a state where the height adjustment jig is placed in the charged particle microscope and corresponds to Steps 601 to 606 in FIG. 6. In FIG. 9(*a*), a state immediately after the above-mentioned height adjustment jig is placed in the above-mentioned charged particle microscope (Step 601) is shown. By moving the XY-plane moving mechanism 417 of the sample stage 5 of the charged particle microscope in this state while performing observation with the charged particle microscope, the target object 416 on the surface of the height adjustment jig 403 can be moved within the field of view (preferably to the center of the field of view) of the charged particle microscope. In FIG. 9(*b*), a state where the target object 416 on the surface of the height adjustment jig 403 is present in the field of view (preferably in the center of the field of view) of the charged particle microscope is shown. In this embodiment, in addition to any of the steps between Step 601 and Step 606 in FIG. 6 or simultaneously with any of the steps, adjustment is performed so that the target object 416 of the height adjustment jig 403 is placed in the field of view of the charged particle microscope by the XY-plane moving mechanism 417.

According to this, the center of the field of view when performing observation with the optical microscope 402 and the center of the field of view when performing observation with the charged particle microscope can be made to coincide with each other through the height adjustment jig 403.

FIG. 10(*a*) shows a state where the sample table 410 with a Z-axis driving mechanism is placed in the optical microscope and corresponds to Steps 610 to 614 in FIG. 6. FIG. 10(*a*) shows a state where the sample table 410 with a Z-axis driving mechanism having the sample 6 mounted thereon is placed in the optical microscope 402 (Step 610), and the focal point is adjusted to the sample by Steps 611 to 613.

FIG. 10(*b*) shows a state where the sample table 410 with a Z-axis driving mechanism is placed in the charged particle microscope and corresponds to Steps 615 to 617 in FIG. 6. FIG. 10(*b*) shows a state where the scale is shifted by only a desired distance of z1 between the diaphragm and the sample from z0 recorded in Step 605 so that the scale of the Z-axis driving mechanism of the sample stage is adjusted to z0-z1 by Step 616. In this embodiment, the field of view of the optical microscope and the field of view of the charged particle microscope have already been made to coincide with each other by the height adjustment jig 403, and therefore, at the time when the sample is placed in the charged particle microscope (Step 615), a region of the sample 6 present in the center of the field of view in FIG. 10(*a*) and a region of the sample 6 present in the center of the field of view in FIG. 10(*b*) coincide with each other. According to this, it is no longer necessary to search the field of view on the charged particle microscope, and therefore, the region of the sample 6 having been observed with the optical microscope 402 can be easily observed also with the charged particle microscope.

Third Embodiment

Next, the shape of the height adjustment jig will be described with reference to FIG. 11. Hereinbelow, a description of the same parts as those of the first and second embodiments will be omitted.

FIG. 11 is a side cross-sectional view of a state where the height adjustment jig is placed in the charged particle microscope. In FIG. 11(*a*), a state where the height adjustment jig 403 in which a region around the target object 416 is not tapered is placed in the charged particle microscope is shown. Further, in FIG. 11(*b*), a state where the height adjustment jig 403 in which the area of the tip is small and a region around the target object 416 is tapered is placed in the charged particle microscope is shown. As shown in FIG. 11(*b*), the height adjustment jig 403 may have a shape such that a face on which the target object 416 is located (that is, a plane which is the upper surface of the height adjustment jig and is closest to the diaphragm) is smaller than the upper surface of the sample placement section 419. When the length of the window frame of the diaphragm 10 is represented by a, the length of the base table 9 is represented by b, and the length of the upper surface of the height adjustment jig 403 is represented by c, the height adjustment jig 403 desirably has a shape which satisfies the following formula.

$$b > c > a \qquad \text{numerical formula 1}$$

Incidentally, in the case where the shapes of the window of the diaphragm 10, the base table 9 of the diaphragm, and the upper surface of the height adjustment jig 403 are circles, a, b, and c represent the diameters of the circles, respectively, however, these shapes are not limited to circles, and may be, for example, polygons. In the case where the shapes are polygons, a, b, and c represent values that indicate the sizes of the polygons (for example, the diameters of circumscribed circles), respectively.

By satisfying the following relationship: b>c, when observation is performed with the charged particle microscope, the surface area of the upper surface of the height adjustment jig 403 which can be observed can be made small, and therefore, the target object 416 can be simply moved to the center of the field of view. That is, in the charged particle microscope, observation cannot be performed in the field of view whose area is equal to or larger than the area of the diaphragm 10, and therefore, in FIG. 11(a), in order to move the target object 416 to the center of the field of view also after the height adjustment jig 403 is made to fall within the field of view for observation, the target object needs to be searched by repeatedly moving on the surface of the height adjustment jig 403. On the other hand, in the case where the area of the tip of the height adjustment jig 403 is small, the field of view for observation is moved less frequently in order to move the target object 416 to the center of the field of view. Further, by satisfying the following relationship: c>a, the length a of the window of the diaphragm 10 is larger than the length c of the upper surface of the height adjustment jig 403, and therefore, the tip of the height adjustment jig 403 can be brought into contact with the base table 9 without coming into contact with the diaphragm 10.

Fourth Embodiment

Next, another variation of the height adjustment jig 403 will be described with reference to FIG. 12 to FIG. 15. Hereinbelow, a description of the same parts as those of the first to third embodiments will be omitted.

The height adjustment jig 403 may have a cavity 418 at a tip of the upper part thereof as described below. Alternatively, the height adjustment jig 403 may have a convex portion 421 on the outer periphery of the upper part thereof. Hereinbelow, an example of the cavity 418 will be described as a representative of a case where the height of a face which is the upper surface of the height adjustment member and faces the diaphragm in an outer peripheral portion is different from that in an inner portion will be described. The depth h0 of the cavity is constant in the bottom surface of the cavity, and when the height adjustment jig is placed on the sample placement section, the distance from the upper surface of the sample placement section to the bottom portion of the cavity 418 is represented by t1 and is constant. For example, h0 is from several micrometers to several tens of micrometers.

In the case where the target object 416 on the surface of the height adjustment jig 403 described above is provided, the target object 416 is provided in a bottom portion of the cavity 418. Further, here, a description will be given using a configuration in which the height adjustment jig 403 has a structure capable of fitting to the positioning structure 420 of the sample placement section 419, however, the height adjustment jig 403 may be used by being placed on the sample table having a structure capable of fitting the height adjustment jig 403 to the positioning structure 420.

FIG. 12 shows a state where the height adjustment jig 403 having the cavity 418 is placed in the charged particle microscope. In FIG. 12(a), a state immediately after the height adjustment jig 403 having the cavity 418 is placed in the charged particle microscope (corresponding to Step 601) is shown. By moving the Z-axis driving mechanism 414 of the sample stage 5 in this state (corresponding to Step 602), the height adjustment jig 403 and the base table 9 of the diaphragm 10 are brought into contact with each other (corresponding to Steps 603 and 604). In FIG. 12(b), a state where the height adjustment jig 403 and the base table 9 of the diaphragm 10 are brought into contact with each other is shown. In this state, the driving amount of the Z-axis driving mechanism 414 (the driving amount is represented by z0) is recorded or stored (corresponding to Step 605). Thereafter, the height adjustment jig 403 is detached from the charged particle microscope (corresponding to Step 606).

Incidentally, the cavity 418 of this embodiment is configured such that the size d of the cavity is larger than the size a of the window frame of the diaphragm 10 and smaller than the size b of the base table 9 of the diaphragm as shown in FIG. 12. In this embodiment, since such a cavity 418 is present, the diaphragm 10 (the window portion of the base table 9) and the height adjustment jig 403 do not come into contact with each other. In the case where the height adjustment jig 403 which does not have the cavity 418 is placed on the sample placement section 419 on the sample stage 5 of the charged particle microscope and is brought into contact with the base table 9 of the diaphragm 10 (FIG. 4(b)), there is a possibility that the height adjustment jig 403 comes into contact with the diaphragm 10 and the diaphragm 10 may be damaged. On the other hand, in the case where the height adjustment jig 403 having the cavity 418 is placed on the sample placement section 419 of the sample stage 5 of the charged particle microscope and is brought into contact with the base table 9 of the diaphragm (FIG. 12(b)), the height adjustment jig 403 comes into contact with only the peripheral portion of the base table 9 of the diaphragm 10 without coming into contact with the diaphragm 10. Due to this, the possibility that the diaphragm 10 may be damaged due to contact between the diaphragm 10 and the height adjustment jig 403 can be reduced. As a result, it becomes possible to reduce the frequency of an operation of replacing the diaphragm due to damage to the diaphragm so as to improve the convenience of the device.

FIG. 13 shows a state where the height adjustment jig 403 having the cavity 418 described above is placed in the optical microscope 402. FIG. 13(a) shows a state immediately after the height adjustment jig 403 of this embodiment is placed in the optical microscope 402 (corresponding to Step 607). By moving the optical microscope position driving mechanism 406 in this state, the focal point is adjusted to the bottom portion of the cavity 418 (corresponding to Step 608). FIG. 13(b) shows a state where the focal point is adjusted thereto. The height adjustment jig 403 is detached without moving the optical microscope position driving mechanism 406 of the optical microscope 402 in this state (corresponding to Step 609).

Thereafter, the sample table 410 with a Z-axis driving mechanism having the sample 6 mounted thereon is placed on the sample placement section 400 of the optical microscope 402 (corresponding to Step 610), and the focal point is adjusted to the sample 6 (corresponding to Steps 612 and 613) by moving the Z-axis driving mechanism 411 (corresponding to Step 611). FIG. 14(*a*) shows a state where the focal point is adjusted thereto. At this time, the height of the sample is t1.

Subsequently, the sample table 410 with a Z-axis driving mechanism is detached from the optical microscope (corresponding to Step 614), and placed in the charged particle microscope (corresponding to Step 615). Then, as shown in FIG. 14(*b*), the scale of the Z-axis driving mechanism 414 of the sample stage 5 is adjusted to z0 (corresponding to Step 616), and the sample is observed (corresponding to Step 617).

Here, the cavity 418 having a known depth of this embodiment has an effect of improving the operability as described below. In the case where the above-mentioned adjustment of the height of the sample is performed using the above-mentioned height adjustment jig 403 which does not have the cavity 418 and the sample is observed with the charged particle microscope, it is necessary to adjust the scale of the Z-axis driving mechanism 414 of the sample stage 5 to z0-z1 after performing confirmation of the Z-axis coordinate of the position of the diaphragm of the charged particle microscope (the step of confirming that the height z is z0 in Step 605) (FIG. 5(*b*)). Here, z1 corresponds to the distance between the diaphragm 10 and the sample 6. However, the operation in which the scale of the Z-axis driving mechanism 414 is adjusted to a value (z0-z1) different from the value z0 obtained in FIG. 4(*b*) is a factor to make the operation of adjusting the height of the sample complicated. On the other hand, in the case where adjustment of the height and adjustment of the Z-axis coordinate of the sample 6 are performed using the height adjustment jig 403 having the cavity 418 whose depth (h0) is known, the depth h0 of the cavity 418 can be made to correspond to z1 in FIG. 5(*b*). According to this, in the case where the sample is observed with the charged particle microscope using the height adjustment jig having the cavity 418 as in this embodiment, when the scale of the Z-axis driving mechanism 414 of the sample stage 5 is adjusted to z0 after performing confirmation of the Z-axis coordinate of the position of the diaphragm of the charged particle microscope (the step of confirming that the height z is z0 in Step 605), the distance between the diaphragm and the sample always becomes the depth h0 of the cavity 418, and therefore, the operability is improved.

Further, the height adjustment jig 403 of this embodiment may have a shape such that the tip is tapered as shown in FIG. 15. That is, as described in the third embodiment, the size of the upper surface of the height adjustment jig 403 (the outer peripheral portion surrounding the cavity) may be made smaller than the size of the upper surface of the sample placement section 419.

Further, the cavity 418 or the convex portion 421 may be formed by combining a plurality of parts with the height adjustment jig. For example, as shown in FIG. 16, a cavity or a convex portion may be formed by placing a ring-shaped part having a hole in the center and also having a thickness of h0 on the height adjustment jig 403.

In FIG. 16, the height adjustment jig 403 is placed on the sample table 410 with a Z-axis driving mechanism, however, this configuration will be described in the below-mentioned sixth embodiment. The cavity 418 having a depth h0 (several micrometers to several tens of micrometers) of the height adjustment jig 403 in the configuration in FIG. 14 is very shallow, and therefore, there is a problem that it is difficult to accurately perform processing. Further, a new height adjustment jig 403 is needed every time the convex portion surrounding the cavity 418 is abraded, and therefore, there is also a problem in terms of cost. On the other hand, in the configuration in FIG. 16, the height adjustment jig 403 does not have the cavity 418, and therefore, processing can be relatively easily performed. Further, also in the case where a ring-shaped part 428 is abraded, the accuracy of the depth h0 of the cavity 418 can be reproduced only by replacing the ring-shaped part 428, and therefore, the above-mentioned problems can be solved. The diameter or the size of the height adjustment jig 403 may be different from the diameter or the size of the ring-shaped part 428. Further, the ring-shaped part 428 may not have a ring shape and may have any shape as long as it has the cavity 418.

Fifth Embodiment

Next, another example in which an optical microscope or the like is utilized for adjusting the center of the field of view of the optical microscope 402 to the center of the field of view of the charged particle microscope when performing observation with the charged particle microscope will be described. Hereinbelow, a description of the same parts as those of the first to fourth embodiments will be omitted.

In the above example, in the case where after observing a specific region of the sample 6 with the optical microscope 402, another region of the sample is observed by moving the sample mounting section 409 in the XY-plane, it is necessary to perform an operation in which the center of the field of view of the optical microscope 402 is adjusted to the center of the field of view of the charged particle microscope using the height adjustment jig 403 having the target object 416 again. Due to this, there is a problem that the operation is complicated. In view of this, a moving mechanism capable of moving the sample in the direction in the XY-plane is provided on the sample table 410 with a Z-axis driving mechanism. An example in which a region to be observed of the sample 6 is moved by this moving mechanism will be described below.

In this embodiment, a sample table 423 with a Z-axis driving mechanism having an XY-plane moving mechanism 422 is used. In FIG. 17 and FIG. 18, necessary structures and states where these structures are combined are shown.

In FIG. 17, a state where a specific region to be observed on the sample 6 is observed using the sample table 423 with a Z-axis driving mechanism of this embodiment is shown. FIG. 17(*a*) shows a state where the sample table 423 with a Z-axis driving mechanism is placed in the optical microscope, and FIG. 17(*b*) shows a state where the sample table 423 with a Z-axis driving mechanism is placed in the charged particle microscope. In this embodiment, a process of performing the height adjustment in the Z-axis direction using the height adjustment jig is the same as in the above-mentioned embodiments. The sample table 423 with a Z-axis driving mechanism of this embodiment has the XY-plane moving mechanism 422. This XY-plane moving mechanism 422 is, for example, a screw mechanism provided with a knob 424 and can move freely in the X-axis direction and the Y-axis direction (that is, in a plane perpendicular to the Z-axis which is the optical axis direction). By operating the knob 424 to move the XY-plane moving mechanism 422, an arbitrary region on the sample 6 is observed under observation with the optical microscope 402 to search a region to be observed, and the region can be moved to the center of the field of view. In the case where another region is observed after this state, the region to be observed is moved by moving the knob 424 of the XY-plane moving mechanism 422 on the sample table 423 with a Z-axis driving mechanism.

FIG. 18 shows a state where the region to be observed is moved by the XY-plane moving mechanism 422. In FIG. 17, a point P on the surface of the sample 6 is observed, and in FIG. 18, a point Q on the surface of the sample 6 is observed. In the case where the point Q is desired to be observed after observing the point P, once the sample table 423 with a Z-axis driving mechanism having the sample 6 mounted thereon is returned under the optical microscope 402, and by moving the XY-plane moving mechanism 422 while performing observation under the optical microscope 402, the position of the point Q is brought to the center of the field of view of the optical microscope. This state is shown in FIG. 18(a). Thereafter, while maintaining the position adjusted by the XY-plane moving mechanism 422 as it is, the sample table 423 with a Z-axis driving mechanism is placed in the charged particle microscope. This state is shown in FIG. 18(b). By doing this, since the center of the field of view of the optical microscope 402 and the center of the field of view of the charged particle microscope are kept coincident with each other, only by placing the sample table 423 with a Z-axis driving mechanism in the charged particle microscope, the point Q is located below the diaphragm 10. That is, the position brought to the center of the field of view by searching the field of view with the optical microscope 402 can be directly brought under the diaphragm (on the optical axis) of the charged particle microscope.

Accordingly, it becomes possible to easily determine and adjust the region to be observed of the sample 6 under the optical microscope 402, and the operability when moving the region to be observed in the charged particle beam microscope capable of performing observation in an atmospheric pressure environment can be greatly improved, and the convenience can be further improved. In this embodiment, the optical microscope and the charged particle microscope are separate bodies and this embodiment is particularly effective in an observation system in which it is necessary to move the sample table between these microscopes by attaching and detaching the sample table.

Further, the configuration in which the optical microscope 402 is used in the determination of the position for performing observation with the charged particle beam microscope has been described, however, by using the above-mentioned configuration, an effect of being able to easily compare an optical microscope image including color information with a charged particle beam image having a higher resolution or including compositional information is also realized. For example, an image obtained by the optical microscope 402 in the present invention is converted into digital information using a CCD camera or the like, and may be displayed on a monitor of a computer 35 on which a microscope image is displayed through a digital signal cable. By displaying an optical microscope image and a charged particle beam image on the same screen, it becomes possible to easily compare both images.

Sixth Embodiment

In the first to fifth embodiments, the configuration in which the height adjustment jig 403 is placed on the sample placement section 400 of the optical microscope 402 and on the sample placement section 419 of the charged particle microscope has been described, however, as described in this embodiment, the height adjustment jig 403 is placed on the sample table 410 with a Z-axis driving mechanism, and the height of the sample may be adjusted. In another expression, in this embodiment, an example in which the height adjustment jig 403 and the sample table 410 with a Z-axis driving mechanism are integrated will be described. Hereinbelow, an example in which the height adjustment jig 403 having a female screw, the sample table 425 having a female screw, and the sample table 410 with a Z-axis driving mechanism having a screw 427 are used will be described, however, the present invention is not limited thereto as long as the device has a structure capable of detachably integrating the height adjustment jig 403 with the sample table 410 with a Z-axis driving mechanism. In FIG. 19, necessary structures and a state where these structures are combined are shown.

The sample table 410 with a Z-axis driving mechanism of this embodiment has a connection mechanism (for example, the screw 427) on the upper part of the sample mounting section 409. The screw 427 may be integrated with the sample mounting section 409 of the sample table 410 with a Z-axis driving mechanism or may be a separate part from the sample mounting section 409 and may be connected to the sample mounting section 409 using a mechanism such as a screw. The screw 427 is, for example, a male screw, and the male screw can be fitted to the female screw included in the height adjustment jig 403 and the sample table 425, and the screw 427 and the height adjustment jig 403 or the sample table 425 can be attached to and detached from each other.

The height adjustment jig 403 of this embodiment is, for example, a female screw, and can be placed on the sample table 410 with a Z-axis driving mechanism by being fitted to the screw 427 which is a male screw. Incidentally, as described above, the height adjustment jig 403 may have either or both of the above-mentioned cavity 418 and target object 416. Further, as described in the third embodiment, the surrounding of the upper surface area of a portion where the target object 416 is placed may have a tapered shape (FIG. 19(a)). First, the height adjustment jig 403 is mounted on the sample table 410 with a Z-axis driving mechanism, and thereafter, the height adjustment jig 403 is detached and the sample table 425 is mounted. A state where the focal point is adjusted to the sample 6 by moving the Z-axis driving mechanism 411 is shown in FIG. 19(b).

The sample table 425 of this embodiment has, for example, a female screw, and can be placed on the sample table 410 with a Z-axis driving mechanism by being fitted to the screw 427 which is a male screw. Here, a fitting portion (for example, a female screw) of the sample table 425 has the same shape as a fitting portion (for example, a female screw) of the height adjustment jig 403. The sample table 425 is placed on the sample table 410 with a Z-axis driving mechanism and is used by mounting the sample 6 thereon.

In the case of a configuration in which the height adjustment jig 403 is fitted to the sample placement section 400 in this embodiment, it has a characteristic that a user can determine the absolute value t2 for adjusting the position by him/herself. The height of the height adjustment jig 403 which has been described so far cannot be changed, however, the height t2 can be changed in the case of a configuration in which the height adjustment jig 403 is fitted to the sample placement section 400. An advantage of being able to change t2 is such that this is helpful when a value (z0) for ascertaining the distance between the diaphragm and the target object 416 is desired to be set to a recognizable value (for example, a value with zeros in the first and second decimal places such as 2.00 mm) or the like. In the case of the height adjustment jig 403 in the first embodiment, the value of z0 fluctuates when the surface of the height adjustment jig 403 is abraded by bringing it into contact with the base table 9 of the diaphragm 10 in FIG. 4(*b*). On the other hand, when the height adjustment jig 403 in this embodiment is integrated with the sample table 410 with a Z-axis driving mechanism, even if the height of the height adjustment jig 403 fluctuates, the fluctuation amount can be adjusted by the sample table 410 with a Z-axis driving mechanism.

Further, in the case of a configuration in which the height adjustment jig 403 is fitted to the sample placement section 400, when there is an inclination or a difference such as a position deviation between fitting of the height adjustment jig 403 to the sample placement section 400 and fitting of the sample table 410 with a Z-axis driving mechanism to the sample placement section 400, there is a problem that it is difficult to accurately adjust the height of the sample to the distance t2 between the upper surface of the sample placement section 400 and the upper surface of the height adjustment jig. On the other hand, in the configuration of this embodiment, as the sample table 410 with a Z-axis driving mechanism, the same member is fitted to the sample placement section 400 when using the height adjustment jig 403 and when using the sample table 425, and therefore, the above-mentioned problem can be solved. For example, it is also considered that loosening occurs when the positioning structure 420 is abraded due to long-term use, and in such a case, this embodiment in which the screw 427 having a screw structure capable of fastening without occurrence of loosening is used is more suitable.

Next, a procedure for implementing this embodiment is shown in FIG. 20. Here, a configuration in which the height adjustment jig 403 has the cavity 418 and the target object 416, and has a shape such that the tip is tapered (FIG. 19(*a*)) will be described as an example, however, as described in the above-mentioned respective embodiments, the operational procedure can be changed as appropriate according to the structure of the height adjustment jig. As different points from FIG. 6, a point that in Step 901, the height adjustment jig 403 and the sample table 410 with a Z-axis driving mechanism are integrated, and a point that after a step of performing placement in the optical microscope 402 and adjusting the focal point (corresponding to Step 909), the height adjustment jig 403 is detached from the screw 427 in this state (corresponding to Step 910) are greatly different.

In a first phase, an operation in which the position in the Z-axis direction of the diaphragm in the charged particle microscope is confirmed using the height adjustment jig is performed.

First, the height adjustment jig 403 is fitted to the screw 427 of the sample table 410 with a Z-axis driving mechanism (Step 901). The sample table 410 with a Z-axis driving mechanism in which the height adjustment jig 403 is fitted to the screw 427 is placed on the sample placement section 400 of the charged particle microscope (Step 902). If the configuration in FIG. 16 is adopted, further the ring-shaped part 428 is mounted on the height adjustment jig 403. Then, the Z-axis driving mechanism 414 of the sample stage 5 is moved until the height adjustment jig 403 and the base table 9 of the diaphragm 10 come into contact with each other (Steps 903 and 904). The determination as to whether these members come into contact with each other can be performed in the same manner as described with respect to Step 603 in FIG. 6. After these members come into contact with each other, the approach of the height adjustment jig is stopped (Step 905), and the position in the Z-axis direction of the sample stage in a state where the height adjustment jig 403 and the base table 9 of the diaphragm 10 come into contact with each other is stored (Step 906). The value of the scale of the Z-axis driving mechanism 414 when the height adjustment jig 403 and the base table 9 of the diaphragm 10 come into contact with each other is z0. Steps 905 and 906 are the same as Steps 604 and 605 in FIG. 6, respectively. Further, Steps 903 to 906 may also be automatically performed in the same manner as the method for automatically performing Steps 602 to 605 described in the first embodiment. Thereafter, the sample table 410 with a Z-axis driving mechanism is detached from the sample placement section 419 of the charged particle microscope (Step 907).

In a second phase, the height of the optical microscope is adjusted using the height adjustment jig 403. First, the sample table 410 with a Z-axis driving mechanism to which the height adjustment jig 403 is connected is placed on the sample placement section 400 of the optical microscope 402 (Step 908). Observation is started, the optical microscope position driving mechanism 406 is moved, and the focal point is adjusted to the height adjustment jig 403 (Step 909). A state where the focal point is adjusted is shown in FIG. 19(*a*). The distance from the cavity 418 (a point to which the focal point of the optical microscope is adjusted) of the height adjustment jig 403 to the upper surface of the sample placement section 400 at this time is represented by t2. Thereafter, the height adjustment jig 403 and the sample table 410 with a Z-axis driving mechanism are separated from each other by detaching the height adjustment jig 403 from the screw 427 without moving the optical microscope position driving mechanism 406 in the above-mentioned state (Step 910).

Subsequently, as a third phase, the height of the sample table with a Z-axis driving mechanism having the sample mounted thereon is adjusted using the optical microscope in a state of being adjusted in the second phase. More specifically, the adjustment is performed by the Z-axis driving mechanism 411 of the sample table 410 with a Z-axis driving mechanism so that the surface of the sample is located at the position of the focal point of the optical microscope adjusted in the second phase.

In the third phase, first, the sample table 425 with the sample 6 mounted thereon is fitted to the screw 427 of the sample table 410 with a Z-axis driving mechanism so as to connect these members to each other (Step 911). At this time, the sample table 425 is attached without detaching the sample table 410 with a Z-axis driving mechanism from the optical microscope. Alternatively, once the sample table 410 with a Z-axis driving mechanism is detached from the optical microscope, and the sample table 425 is attached, and thereafter, the sample table 410 with a Z-axis driving mechanism to which the sample table 425 is connected may be placed on the sample placement section 400 of the optical microscope 402. Subsequently, while performing observation with the optical microscope 402, the Z-axis driving mechanism 411 of the sample table 410 with a Z-axis driving mechanism is moved so that the focal point of the optical microscope 402 is adjusted to the sample 6 (Step 912). In Step 912, it is important to maintain the state adjusted in the second phase without moving the optical microscope position driving mechanism 406. The determination as to whether the focal point is adjusted (Step 913) can be performed in the same manner as described with respect to Step 612 in FIG. 6. FIG. 19(b) shows a state where the focal point of the optical microscope 402 is adjusted to the sample 6. When the sample is located at the focal point, the operation of the Z-axis driving mechanism 411 is stopped (Step 914). The height of the sample at this time coincides with t2 in Step 908. Thereafter, the sample table 410 with a Z-axis driving mechanism to which the sample table 425 with the sample mounted thereon is connected is detached from the sample placement section 400 of the optical microscope 402 (Step 915). At this time, the sample table 410 is detached without moving the Z-axis driving mechanism 411 in the state of Step 913.

In a fourth phase, the Z-axis coordinate of the sample 6 in the charged particle microscope is adjusted. First, the sample table 410 with a Z-axis driving mechanism is placed on the sample placement section 419 of the charged particle microscope while remaining in a state of being detached in Step 914 (Step 916). Thereafter, the scale of the Z-axis driving mechanism 411 of the sample stage 5 is adjusted to z0 (Step 917) and observation is started (Step 918). Incidentally, in the case where the height adjustment jig which does not have the cavity 418 is used, as in Step 616 in FIG. 6, the position on the Z-axis may be shifted from z0 by the distance between the diaphragm and the sample. Step 916 to Step 918 are substantially the same as Step 615 to Step 617 in FIG. 6.

Seventh Embodiment

In the first to sixth embodiments, the configuration in which the optical microscope is used as the optical observation device has been described, however, in this embodiment, an example in which an optical laser device is used as the optical observation device will be described. Hereinbelow, a description of the same parts as those of the first to sixth embodiments will be omitted.

A method for adjusting the height of the sample to the height t0 of the height adjustment jig 403 by an optical laser device 500, the height adjustment jig 403, and the sample table 410 with a Z-axis driving mechanism will be described with reference to FIGS. 21 to 23. In the example in which the optical microscope is used, the determination as to whether or not the surface of the sample is adjusted to the focal point of the optical microscope when the surface of the sample is adjusted to the focal point by moving the Z-axis driving mechanism 411 of the sample table 410 with a Z-axis driving mechanism is performed by an operator through visual observation.

Therefore, there was a problem that the height Z of the sample does not have a quantitative property. On the other hand, the optical laser device in this embodiment has a characteristic that the height can be recognized as an absolute value by a laser.

The optical laser device 500 in this embodiment includes a light emitting section 502 which emits a laser and a light receiving section 503 which includes an element that acquires a reflected light from the sample generated by irradiation of the sample with the laser. The light emitting section 502 and the light receiving section 503 may be integrated in a laser device 501. An optical laser device position driving mechanism 504 for moving the laser device 501 or the like in the Z-axis direction, a base table 505 which supports the optical laser device 500 with respect to the contact surface of the device and includes the optical laser device position driving mechanism 504, and a meter 507 for displaying a distance from the reference surface of the optical laser device 501 to the laser irradiation point are included.

The optical laser device 501 includes a sample placement section 506. This sample placement section 506 has a positioning structure 508 for fitting the height adjustment jig 403 and the sample table 410 with a Z-axis driving mechanism in the same manner as being included in the sample stage 5 of the charged particle microscope.

Hereinbelow, a description will be given using a device which irradiates a laser in advance, and thereafter sets a reference point 502 from which the laser is reflected, and measures displacement from the reference point 502, however, a device which measures an absolute distance from the reference point of the optical laser device itself to a point irradiated with a laser may be adopted. With reference to FIG. 21, FIG. 21 is an explanatory view of an operation when the height adjustment jig 403 is placed in the optical laser device 501, and the optical laser device 500 is adjusted using the height adjustment jig 403. In FIG. 21(a), a state where the height adjustment jig 403 is placed on the sample placement section 506 of the optical laser device 501 is shown. By moving the optical laser device position driving mechanism 504 in this state, the surface of the height adjustment jig 403 is made to fall within the detection distance range of the optical laser device 501. The value of the meter of the optical laser device at this time is represented by z2. This state is shown in FIG. 21(b). The value of this z2 may be stored by a user, or a function to adjust the position of z2 to 0 may be included in the meter 507.

FIG. 22(a) shows a state where the sample table 410 with a Z-axis driving mechanism having the sample 6 mounted thereon is placed in the optical laser device 501 is shown. In FIG. 22(b), a state where a laser is irradiated on the surface of the sample, and the Z-axis driving mechanism 411 of the sample table 410 with a Z-axis driving mechanism is moved so as to adjust the value of the meter 507 to z2. When the value of the meter 507 is adjusted to z2 by moving the Z-axis driving mechanism 411 of the sample table 410 with a Z-axis driving mechanism, the height of the sample coincides with the height t0 of the height adjustment jig 403. At this time, the Z-axis driving mechanism 411 moves independently, and therefore, the meter 507 can be adjusted to z2 while fixing the optical laser device position driving mechanism 504. As described above, z2 may be adjusted to 0 by using the function included in the meter 507. In the case where the value of z2 is adjusted to 0, in the meter 507, the distance from the reference point 502 is displayed on the meter 507, and therefore, it is easy to know the amount to move the Z-axis driving mechanism 411. As described above, according to this embodiment, the height of the sample can be quantitatively determined.

Hereinabove, the description has been given using the configuration in which the light emitting section 502 and the light receiving section 503 are driven in the Z-axis direction so as to adjust the distance from the sample, however, as shown in FIG. 23, a configuration in which the laser device 502 is fixed, and a sample stage 509 is provided on the base table 505 and is driven in the Z-axis direction so as to adjust the distance from the sample (or the sample placement section 506) may be adopted. In the case of this configuration, the laser device 501 itself may not move, and therefore, this is a device configuration capable of more stably performing measurement in consideration of when the distance z2 is measured.

Eighth Embodiment

In FIG. 1, the device in which a space where the sample 6 is placed is in a completely atmospheric state has been described. In this embodiment, a configuration in which the above-mentioned embodiments are applied to a charged particle beam device capable of performing observation not only in an atmospheric pressure, but also in a state of a slightly reduced pressure (about $10^5$ Pa to about $10^3$ Pa) as compared with an atmospheric pressure or in a desired gas atmosphere will be described with reference to FIG. 24. The charged particle beam device of this embodiment is mainly constituted by a charged particle optical lens barrel 2, a first housing (hereinafter sometimes referred to as "vacuum chamber") 7 which supports the charged particle optical lens barrel with respect to a device placement surface, a second housing (hereinafter sometimes referred to as "attachment") 121 which is used by being inserted into the first housing 7, a sample stage 5 which is placed in the second housing, and a control system which controls these members. The basic configurations of the control system and the like are the same as in FIG. 1, and therefore, a detailed description thereof will be omitted.

At least one side surface among the side surfaces in the shape of a rectangular parallelepiped of the second housing 121 is an open surface. The surfaces other than a surface on which the diaphragm holding member 155 is placed among the side surfaces in the shape of a rectangular parallelepiped (a body section) of the second housing 121 is constituted by the walls of the second housing 121. Alternatively, the surfaces may be constituted by the side walls of the first housing 7 in a state where the second housing 121 itself does not have walls and is integrated into the first housing 7. The second housing 121 is inserted into the first housing 7 through an opening portion provided on the side wall of the first housing 7, and has a function to store the sample 6 to be observed in a state of being integrated into the first housing 7. Fixing to an outer wall surface on the side surface side is achieved between the first housing 7 and the second housing 121 through a vacuum sealing member 126. The second housing 121 may be fixed to any of the side surface or the inner wall surface of the first housing 7 or the charged particle optical lens barrel. According to this, the entire second housing 121 is fitted to the first housing 7. It is most simple to form the opening portion of the first housing 7 by utilizing an opening for carrying in and out of the sample originally provided for the vacuum sample chamber of the charged particle microscope. That is, by forming the second housing 121 in accordance with the size of the hole originally opened and attaching the vacuum sealing member 126 to the periphery of the hole, modification of the device can be reduced to the necessary minimum. Further, it is also possible to detach the second housing 121 from the first housing 7.

The side surface of the second housing 121 is an open surface communicating with an air space through a face with a size capable of at least taking in and out the sample, and the sample 6 stored in the second housing 121 is put in a state of an atmospheric pressure or a state of a slightly negative pressure or a state of a desired gas species during observation. Incidentally, FIG. 24 is a cross-sectional view of the device in the direction parallel to the optical axis and therefore shows only one open surface, however, the number of open surfaces of the second housing 121 is not limited to one as long as vacuum sealing is achieved by the side surfaces of the first housing in the depth direction and the front direction of the sheet of FIG. 24. It is only necessary that at least one or more open surfaces be provided in a state where the second housing 121 is integrated into the first housing 7. By the open surface of the second housing, it is possible to perform carrying in and out of the sample between the inside and the outside of the second housing (attachment).

On the upper surface side of the second housing 121, the diaphragm 10 capable of allowing a charged particle beam to penetrate or pass therethrough is provided. This diaphragm 10 can be attached to and detached from the second housing 121. To the first housing 7, the vacuum pump 4 is connected, and it is possible to perform vacuum evacuation of a closed space (hereinafter referred to as "first space 11") constituted by the inner wall surface of the first housing 7, the outer wall surface of the second housing, and the diaphragm 10. According to this, in this embodiment, while the first space 11 is maintained at a high vacuum by the diaphragm 10, a space where the sample is held (in the drawing, a space surrounded by the diaphragm, the second housing 121, and a lid member 122, hereinafter referred to as "second space 12") is maintained in a gas atmosphere at an atmospheric pressure or at a pressure substantially equal to an atmospheric pressure, and therefore, the space on the charged particle optical lens barrel 2 side can be maintained in a vacuum state during the operation of the device, and also the sample 6 and the above-mentioned sample table can be maintained in an atmosphere at an atmospheric pressure or a given pressure. The diaphragm 10 is held by the diaphragm holding member 155, and the replacement of the diaphragm 10 can be performed by replacing the diaphragm holding member 155.

Incidentally, in the first space 11, the degree of vacuum can be adjusted. That is, it is also possible to form a low vacuum environment by introducing a gas molecule into the first space. The gas molecule can be introduced through an air inlet port 27 while limiting the flow rate thereof by, for example, a needle valve 28.

In the case of the charged particle microscope of this embodiment, the open surface which forms at least one side surface of the second housing 121 can be covered with the lid member 122. The lid member 122 is provided with the sample stage or the like.

In the charged particle microscope of this embodiment, a function to supply a replacement gas into the second housing 121 or a function capable of forming an atmospheric pressure state different from that of the first space is included. A charged particle beam emitted from the lower end of the charged particle optical lens barrel 2 passes through the diaphragm 10 shown in FIG. 24 through the first space 11 maintained at a high vacuum, and further penetrates into the second space 12 maintained in a state of an atmospheric pressure or a slightly negative pressure. That is, the second space is in a state of being a poorer degree of vacuum (a lower degree of vacuum) than the first space. In an air space, the charged particle beam is scattered by the gas molecule, and therefore, the average free path is shortened. That is, when the distance between the diaphragm 10 and the sample 6 is large, a primary charged particle beam or a secondary charged particle, a reflected charged particle, or a penetrating charged particle generated by irradiation with the primary charged particle beam does not reach the sample and the detector 3. On the other hand, the probability of scattering of the charged particle beam is proportional to the mass number or density of the gas molecule. Therefore, by replacing the second space with a gas molecule having a lower mass number than air, or by slightly performing vacuum evacuation of the second space, the probability of scattering of the charged particle beam is decreased, so that the charged particle beam can reach the sample. Further, it is only necessary to be able to perform gas replacement of the air in at least the passage path of the charged particle beam in the second space, that is, in the space between the diaphragm and the sample even if it is not in the entire second space. As for the type of the replacement gas, an effect of improving the S/N ratio of an image is observed as long as the gas is a lighter gas than air such as nitrogen or water vapor, however, helium gas or hydrogen gas having a much lighter mass has a higher effect of improving the S/N ratio of an image.

Due to the reason described above, in the charged particle microscope of this embodiment, an attaching section (gas introduction section) for a gas supply tube 100 is provided for the lid member 122. A gas supply tube 100 is connected to a gas cylinder 103 through a connection section 102, and according to this, the replacement gas is introduced into the second space 12. In the middle of the gas supply tube 100, a gas control valve 101 is placed, and the flow rate of the replacement gas flowing in the tube can be controlled. According to this, a signal line extends from the gas control valve 101 to the lower-level control section 37, and a device user can control the flow rate of the replacement gas in the operational screen to be displayed on the monitor of the computer 35. Further, the gas control valve 101 may be opened and closed by manual operation.

The replacement gas is a light element gas, and therefore is likely to remain in the upper part of the second space 12, and the gas on the lower side is hardly replaced. Therefore, an opening which communicates the inside and the outside of the second space is provided on the lower side than the attaching position of the gas supply tube 100 in the lid member 122. For example, in FIG. 24, an opening is provided at the attaching position of a pressure control valve 104. According to this, the atmospheric gas is pushed by the light element gas introduced from the gas introduction section and is discharged from the opening on the lower side, and therefore, the inside of the second housing 121 can be efficiently replaced with the gas. Incidentally, this opening may be allowed to also serve as the below-mentioned rough evacuation port.

Further, even if the replacement gas is a light element gas such as helium gas, electron beam scattering is large in some cases. Further, when a large amount of water is present on the surface of the sample, it is necessary to slightly evaporate water. In such a case, the gas cylinder 103 may be replaced with a vacuum pump. Then, by slightly performing vacuum evacuation, the inside of the second housing can be brought into an extremely low vacuum state (that is, an atmosphere at a pressure close to an atmospheric pressure), and further, only water on the surface of the sample can be evaporated. For example, a vacuum evacuation port is provided for the second housing 121 or the lid member 122, and vacuum evacuation of the inside of the second housing 121 is performed once. Thereafter, the replacement gas may be introduced. In the vacuum evacuation in this case, it is only necessary to reduce the atmospheric gas components remaining in the second housing 121 to a predetermined amount or less, and therefore, it is not necessary to perform high vacuum evacuation, and rough evacuation is enough. This is, for example, at a pressure in the range of about $10^5$ Pa to about $10^3$ Pa, and so on.

However, in the case where a sample containing water such as a biological sample or the like is observed, the sample once placed in a vacuum state changes its state due to evaporation of water. Therefore, it is preferred that observation is performed before complete evaporation, or as described above, the replacement gas is directly introduced from the air atmosphere. By closing the open surface of the second housing 121 with the lid member after introducing the replacement gas, the replacement gas can be effectively confined in the second space.

In this manner, in this embodiment, the space where the sample is placed can be controlled at an arbitrary degree of vacuum from an atmospheric pressure (about $10^5$ Pa) to about $10^3$ Pa. In a conventional so-called low vacuum scanning electron microscope, an electron beam column and a sample chamber communicate with each other, and therefore, when the degree of vacuum in the sample chamber is decreased so as to increase the pressure to near the atmospheric pressure, the pressure in the electron beam column is also changed in conjunction with it, and thus, it was difficult to control the sample chamber at a pressure from an atmospheric pressure (about $10^5$ Pa) to about $10^3$ Pa. According to this embodiment, the second space 12 and the first space 11 are separated from each other by a thin film, and therefore, the atmospheric pressure and the gas species in the second space surrounded by the second housing 121 and the lid member 122 can be freely controlled. Therefore, it is possible to control the sample chamber at a pressure of an atmospheric pressure (about $10^5$ Pa) to about $10^3$ Pa, which has been difficult to control so far. Further, it becomes possible not only to perform observation at an atmospheric pressure (about $10^5$ Pa), but also to perform observation of the state of the sample by continuously changing the pressure near the atmospheric pressure.

When a three-way valve is attached at the position of the opening, this opening can be allowed to serve as a rough evacuation port and an evacuation port for leaking air. That is, when one port of the three-way valve is attached to the lid member 122, another port is connected to the vacuum pump for rough evacuation, and the one remaining port is attached to the leak valve, the above-mentioned shared evacuation port can be realized.

In place of the above-mentioned opening, the pressure control valve 104 may be provided. The pressure control valve 104 has a function to automatically open the valve when the internal pressure of the second housing 121 is increased to 1 atm or more. By including the pressure control valve having such a function, at the time of introducing a light element gas, when the internal pressure is increased to 1 atm or more, the valve is automatically opened so as to discharge the atmospheric gas components such as nitrogen and oxygen to the outside of the device, and therefore, the inside of the device can be filled with the light element gas. Incidentally, the gas cylinder or the vacuum pump 103 shown in the drawing is sometimes provided for the charged particle microscope, or is sometimes attached thereto after the fact by a device user.

The lid member 122 is provided with the sample stage 5. On the sample stage 5, the sample placement section 419 for placing the height adjustment jig 403 and the sample table 410 with a Z-axis driving mechanism in the present invention is provided. The sample placement section 419 has the positioning structure 420 for fitting the height adjustment jig and the sample table 410 with a Z-axis driving mechanism. This positioning structure 420 can maintain the central axis of the sample placement section 400 and the central axis of the height adjustment jig 403 and the sample table 410 with a Z-axis driving mechanism in a given positional relationship when the height adjustment jig 403 and the sample table 410 with a Z-axis driving mechanism are fitted. The sample stage 5 is fixed to the lid member 122, and therefore, when the lid member 122 is brought into close contact with a fitting section 132 of the second housing 121, the positional relationship between the diaphragm 10 and the sample stage is always constant. Therefore, as compared with the configuration of the device in FIG. 1, in the configuration of the device in FIG. 24, even if the sample stage 5 is moved in the transverse direction of the sheet for replacing the sample, when the lid member 122 is brought into close contact with the fitting section 132 of the second housing 121, the positional relationship among the positioning structure 420, the charged particle beam optical axis 200, and the diaphragm 10 can always be brought to the same position.

Ninth Embodiment

A method for ascertaining the distance between the sample and the diaphragm of the present invention can also be used for a sample storage container which is enclosed in an air space and includes the diaphragm. In FIG. 25 and FIG. 26, an overall structural view of a sample storage container of this embodiment is shown. The sample storage container shown in FIG. 25 is mainly constituted by a storage container 700, a lid 701, a sample table 702, a sample stage 703 having a driving mechanism for changing the position of the sample table 702, a plurality of operation sections 704 for moving the sample stage 703 from the outside of the sample storage container, a machine element 728 located between the operation section 704 and the sample stage 703, a diaphragm 10 which allows a charged particle beam to pass or penetrate therethrough, and a diaphragm holding member 706 which holds the diaphragm 10. A sample 6 is placed on the sample table 702, and is stored in the storage container 700 which is a closed space along with the sample table. In order to maintain a state where the gas species and the atmospheric pressure in the outside and the inside of this sample storage container are separated, a vacuum sealing member 707 such as an O-ring or a packing is provided between the lid 701 and the storage container 700. The lower surface of the sample stage 703 and the bottom surface of the storage container 700 are assumed to be fixed with a screw or the like (not shown).

The lid 701 can be attached to and detached from the storage container 700. As described later, the inside of the storage container 700 in a state of being placed in the charged particle beam device is a space at an atmospheric pressure or a desired gas pressure, and the outside of the storage container 700 is in a vacuum state. Therefore, a force is applied in the direction in which the lid 701 is pushed from the inside of the storage container 700. Due to this, a configuration in which the lid 701 is not detached even if the force is applied in the direction in which it is pushed from the inside of the storage container 700 by a combination of a protrusion 709 connected to the lid 701 and a protrusion 710 connected to the storage container 700. In this case, by sliding the lid 701 in the direction perpendicular to the sheet in the drawing, the lid 701 can be attached to and detached from the storage container 700. Further, in another example, the lid 701 and the storage container 700 may be fixed to each other with a screw or the like (not shown). In still another example, a male screw and a female screw are formed in the storage container 700 and the lid 701 in themselves, and these members may be connected to each other by combining and rotating these screws. The fixing unit of the lid 701 is not limited to the above-mentioned example, and the lid 701 may be fixed with such a force that the lid 701 and the storage container 700 can withstand the pressure difference between the inside and the outside of the sample storage container.

In this embodiment, the sample stage 703 is configured to include a Z-axis driving mechanism capable of driving the sample stage in the direction in which the position of the sample 6 moves closer to or away from the diaphragm, and an XY-axis driving mechanism capable of driving the sample stage in the transverse direction in the drawing or in the direction perpendicular to the sheet. Therefore, a plurality of operation sections 704 (interfaces) are placed. A rotation driving mechanism for rotating the sample 6 on the sample table may be provided. These driving mechanisms are placed inside the sample storage container, and the sample stage 703 is operated by the operation section 704 provided outside the sample storage container through the machine element 728. The machine element 728 is, for example, a rotating shaft, rod, or the like. The operation section 704 can be operated by being rotated, pushed, pulled, or the like. The vacuum sealing member 707 such as an O-ring or a packing is provided between the storage container 700 and the machine element 728 so that the gas type and the atmospheric pressure state are not changed in the outside and the inside of the sample storage container. According to this configuration, the pressure difference between the inside and the outside of the sample storage container is maintained, and the sample 6 and the diaphragm can be driven independently while maintaining the atmospheric state (pressure and gas type) in the inside of the sample storage container. That is, according to the above-mentioned position adjustment mechanism, the position of the sample 6 with respect to the diaphragm 10 can be adjusted from the outside of the sample storage container. Incidentally, as described later, the sample storage container is placed on a flat plane section such as a stage or a table inside the charged particle beam device, and the operation section 704 is operated while observing the sample with the optical microscope or the like. Therefore, it is desirable that many of the operation sections 704 be disposed on the side surface side of the sample storage container as shown in the drawing. The sample 6 and the diaphragm 10 are not in contact with each other, and the sample can be moved in the direction parallel to the diaphragm 10 independently of the diaphragm 10, and therefore, it becomes possible to perform observation of the sample in a very wide range (a range larger than at least the area of the diaphragm).

On the lower side (bottom surface side) of the sample storage container, a fitting section 711 for placement on the sample stage inside the below-mentioned charged particle beam device is provided. The fitting section 711 is shown in a convex form, but may be in a concave form, or may be in another form. By connecting the fitting section 711 to a portion corresponding to the sample stage, the sample storage container is fixed onto the sample stage.

The sample 6 is placed in the sample storage container. The sample 6 is mounted on the sample table 702 provided on the sample stage 703. In the case where the sample 6 is detached from the sample storage container, only the sample 6 may be detached, or the sample 6 may be detached along with the sample table 702.

The lid 701 is provided with the diaphragm holding member 706 including the diaphragm 10. Airtightness is maintained by providing an adhesive, a double-sided adhesive tape, a vacuum grease, an O-ring, a packing, or the like between the lid 701 and the diaphragm holding member 706. A charged particle beam flies from the upper part in the drawing of the lid 701 and the diaphragm 10 and the sample 6 are irradiated with the charged particle beam, and therefore, the lid 701 is provided with an opening portion 712. As described later, a detector for detecting a secondary charged particle emitted from the sample is placed on the upper part of the lid 701. Therefore, in order to efficiently detect the secondary charged particle, the opening portion 712 desirably has a shape such that the area of the opening of the upper surface of the lid 701 is wider than that of the lower surface of the lid 701. In the drawing, a configuration in which the opening portion 712 has a tapered shape is shown.

The sample storage container is provided with a gas inlet port 714 and a gas outlet port 715. These have a valve mechanism so that an atmospheric state of the outer space of the sample storage container and a gas atmospheric state of the inner space 718 can be separated from or communicated with each other. A desired gas is introduced from the gas inlet port 714 in a state where the storage container 700 is closed by the lid 701. However, when the pressure in the sample storage container increases excessively, there is a fear that the diaphragm 10 is ruptured. Due to this, when a gas is introduced from the gas inlet port 714 in a state where the gas outlet port 715 is opened, the inner space 718 is filled with a gas atmosphere at a desired pressure without applying a pressure to the diaphragm 10. The gas outlet port 715 may be a safety valve or the like which is automatically opened when the pressure in the inner space 718 is higher than in the outer space of the sample storage container. Further, it is also possible to attach a vacuum pump to the gas outlet port 715, and in such a case, the sample storage container can be brought to a state of a desired gas species at a low pressure. Further, not only a gas, but also a liquid may be let in and out through the gas inlet port and the gas outlet port described above.

The sample storage container is provided with a current input terminal 716 for transmitting and receiving an electrical signal in the vicinity or the like of the sample 6. An adhesive, an O-ring, a packing, or the like (not shown) is provided between the current input terminal 716 and the storage container 700, and an airtight state in the storage container is maintained. An electrical signal is transmitted or received in the vicinity of the sample 6 through a wiring or the like (not shown) from the current input terminal 716. This current input terminal 716 can be used for application of an electric field, a temperature heater, measurement of a temperature, or the like. Further, when a detection element is placed in the sample storage container and a signal line from the detection element is connected to the current input terminal 716, a signal generated in the sample storage container can be acquired. In this manner, the current input terminal 716 can also be used as an electrical signal output terminal. Specifically, as the sample table 702 under the sample 6, a detection element such as a scintillator which converts a charged particle beam into a light or an electrical signal or a semiconductor detector is used, a transmitted charged particle beam transmitted through the sample 6 can be acquired, and therefore, the internal information of the sample can be acquired. The inside of the sample storage container is in an atmospheric state or a gas state, and therefore, it is desirable that when the internal information of the sample is detected, the distance between the sample and the detection element be set shorter than the distance at which most of the transmitted charged particle beam is scattered. That is, it is necessary to shorten the average free path of the transmitted charged particle beam. The distance between the diaphragm and the sample and the allowable distance between the sample and the detector vary depending also on the irradiation conditions such as the acceleration voltage of the charged particle beam, however, realistically, the distance is required to be, for example, 1 mm or less. Therefore, it is desirable that the sample 6 be directly placed on the detection element. Alternatively, the sample may be placed on a thin mesh having a thickness of 1 mm or less.

<Description of Charged Particle Beam Device>

Next, in FIG. 26, a state where the sample storage container is placed inside the charged particle microscope device is shown. The basic configuration of the charged particle microscope of this embodiment is equivalent to that in FIG. 1, and therefore, a detailed description will be omitted.

The side surface of the housing 7 can separate the atmospheric pressure state between the outside the device and the inside of the housing 7 through a lid member 50. A vacuum sealing member 107 is provided between the lid member 50 and the housing 7, and the lid member 50 is detachably fixed to the housing 7 through the vacuum sealing member 107. The charged particle microscope of this embodiment changes the positional relationship between the sample and the charged particle optical lens barrel after the above-mentioned sample storage container is placed inside the housing 7, and therefore includes a stage 5 as a unit for moving the sample storage container. A support plate 708 to serve as a bottom plate for supporting the lid member 50 is attached, and the stage 5 is fixed to the support plate 708. On the bottom surface of the housing 7 and the lower surface of the lid member 50, a lid member support member 18 and a bottom plate 20 are provided, respectively. The lid member support member 18 is detachably fixed to the bottom plate 20, and the lid member 50 and the lid member support member 18 can be detached all together from the housing 7.

On the bottom plate 20, a prop to be used as a guide for pulling out the lid member 50 when the sample storage container is detached is provided. In a state at the time of normal observation, the prop is stored in a storage section provided on the bottom plate 20 and is configured to extend in the direction in which the lid member 50 is pulled out when it is detached. Further, the prop is fixed to the lid member support member 18, so that the lid member 50 and the charged particle microscope body are not completely separated from each other when the lid member 50 is detached from the housing 7. According to this, the stage 5 or the sample 6 can be prevented from dropping.

The support plate 708 is attached so as to extend to the inside of the housing 7 toward the opposite surface of the lid member 50. A support shaft extends from each of a Z-axis driving mechanism and an XY driving mechanism provided for the stage 5, and the support shafts are connected to an operation knob 51 and an operation knob 52 provided for the lid member 50, respectively. A device user can adjust the position of the sample storage container with respect to the charged particle optical lens barrel by operating these operation knobs. Here, as described above, a position adjustment mechanism is provided also in the sample storage container, and this position adjustment mechanism and the stage can move independently. The position adjustment mechanism in the sample storage container is utilized for adjusting the positions of the sample and the diaphragm, and the stage is utilized for adjusting the positions of the charged particle beam optical lens barrel and the sample storage container.

<Sample Observation Method>

A method in which after a sample is placed in the sample storage container described above, the sample storage container is placed in the charged particle beam device, and then, the sample in an atmospheric pressure or in a gas atmosphere is irradiated with a charged particle beam will be described in detail.

The optical microscope 402 in this embodiment is configured to include the XY-plane moving mechanism 415, and the other configuration and function are equivalent to those of the above-mentioned embodiments.

First, the height adjustment jig 403 is placed in the storage container 700, and the lid 701 provided with the diaphragm 10 is attached. In the subsequent step, the storage container 700 is placed under the optical microscope 402. In the subsequent step, by using the optical microscope position driving mechanism 406 provided for the optical microscope 402, the focal point position 408 is adjusted to the diaphragm 10. The manner at this time is shown in FIG. 27(a). However, this step may not be performed. In the subsequent step, by using the stage 703 provided in the storage container 700, the height adjustment jig 403 is brought into contact with the diaphragm holding member 706 of the diaphragm 10. It is found on an image acquired by the charged particle microscope that when the height adjustment jig 403 and the diaphragm holding member 706 come into contact with each other, the base table 9 slightly moves to any of the left, right, top, and bottom, and therefore, it is possible to determine whether these members come into contact with each other by observing the diaphragm holding member 706 of the diaphragm 10 with the charged particle microscope. Incidentally, the determination as to whether these members come into contact with each other may be performed by confirming electrical conduction. The manner at this time is shown in FIG. 27(b). In the subsequent step, by using the optical microscope position driving mechanism 406 provided for the optical microscope 402, the focal point position 408 is adjusted to the height adjustment jig 403. According to this, the possibility that the sample comes into contact with the diaphragm in the below-mentioned process can be reduced.

In the subsequent step, the sample 6 is mounted in the storage container 700 in a state where the lid 701 provided with the diaphragm 10 is detached. The manner at this time is shown in FIG. 28(a). In the subsequent step, the sample is moved using the stage 703 included in the storage container 700 so as to adjust the focal point 408 of the optical microscope 402 to the sample. At this time, the z value (z2 in the drawing) of the stage 703 when the focal point of the optical microscope is adjusted to the sample is recorded. The position of the sample at this time when the z value is z2 is a virtual position of the diaphragm 10. The manner at this time is shown in FIG. 28(b).

In the subsequent step, after lowering z using the stage 703, the lid 701 provided with the diaphragm is attached. The manner at this time is shown in FIG. 29(a). In the subsequent step, when z is set to z2, the sample 6 is located exactly at the position of the diaphragm 10. The manner at this time is shown in FIG. 29(b). In this manner, it becomes possible to ascertain the distance between the sample and the diaphragm by utilizing the optical microscope and the height adjustment jig. In the subsequent step, the sample storage container is placed in the charged particle microscope device in a state where the sample 6 and the diaphragm 10 come closer to each other. The manner at this time is shown in FIG. 26. In the subsequent step, observation is performed.

In FIG. 30, steps of ascertaining the distance between the diaphragm and the sample using the optical microscope described above is shown.

The sample storage container in this embodiment can be placed in a general charged particle microscope device, and therefore has a characteristic that a sample in an atmospheric pressure can be observed even without using a charged particle microscope device capable performing observation in an atmospheric pressure as shown in FIG. 1 or FIG. 24.

Note that the present invention is not limited to the above-mentioned embodiments, and various variations are included in the present invention. For example, the above-mentioned embodiments are explained in detail in order to plainly explain the present invention, and the embodiments are not always limited to embodiments including all of the described configurations. A part of the configuration of a certain embodiment can be replaced with the configuration of another embodiment. Further, the configuration of another embodiment can also be added to the configuration of a certain embodiment. In addition, a part of the configuration of each embodiment can be deleted or replaced with another configuration, or another configuration can be added thereto. Further, a part of or the whole of each of the above-mentioned configurations, functions, processing sections, processing means, and the like may be realized by a hardware by, for example, performing designing or the like with an integrated circuit. In addition, the above-mentioned configurations, functions, and the like may be realized by a software by, for example, allowing a processor to interpret and execute a program for realizing the respective functions.

Information such as programs, tables, and files for realizing the respective functions may be placed on a recording device such as a memory, a hard disk, or an SSD (Solid State Drive) or a recording medium such as an IC card, an SD card, or an optical disk.

Further, with respect to control lines and information lines, those considered to be required for the description are illustrated, and all the control lines and information lines on the product are not necessarily illustrated. It is conceivable that in fact, almost all components are mutually connected.

REFERENCE SINGS LIST

1: optical lens, 2: charged particle optical lens barrel, 3: detector, 4: vacuum pump, 5: sample stage, 6: sample, 7: housing, 8: charged particle source, 9: base table, 10: diaphragm, 11: first space, 12: second space, 14: leak valve, 15: open surface, 16: vacuum pipe, 17: stage support table, 18: lid member support member, 20: bottom plate, 35: computer, 36: upper-level control section, 37: lower-level control section, 43, 44: communication line, 50: lid member, 51: operation knob, 52: operation knob, 100: gas supply tube, 101: gas control valve, 102: connection section, 103: gas cylinder or vacuum pump, 104: pressure control valve, 108, 109: operation knob, 121: second housing, 122: lid member, 123, 124, 125, 126: vacuum sealing member, 131: body section, 132: fitting section, 154: signal amplifier, 155: diaphragm holding member, 200: optical axis, 270: base, 400: sample placement section, 401: positioning structure, 402: optical microscope, 403: height adjustment jig, 405: lens barrel, 406: optical microscope position driving mechanism, 407: base table, 408: focal point position, 409: sample mounting section, 410: sample table with Z-axis driving mechanism, 411: Z-axis driving mechanism, 412: objective lens, 413: lens barrel, 414: Z-axis driving mechanism, 415: XY-plane moving mechanism, 416: target object, 417: XY-plane moving mechanism, 418: cavity, 419: sample placement section, 420: positioning structure, 421: convex portion, 422: XY-plane moving mechanism, 423: sample table with Z-axis driving mechanism, 424: knob, 425: sample table, 427: screw, 428: ring-shaped part, 500: optical laser device, 501: laser device, 502: light emitting section, 503: light receiving section, 504: optical laser device position driving mechanism, 505: base table, 506: sample placement section, 507: meter, 508: positioning structure, 509: sample stage, 700: storage container, 701: lid, 702: sample table, 703: sample stage, 704: operation section, 705: diaphragm, 706: diaphragm holding member, 707: vacuum sealing member, 708: support plate, 709: protrusion section, 710: protrusion section, 711: fitting section, 712: opening portion, 713: tapered hole, 714: gas inlet port, 715: gas outlet port, 716: current input terminal, 718: inner space, 728: machine element

The invention claimed is:

1. A method for adjusting the height of a sample in a charged particle beam device which includes a charged particle optical lens barrel that generates a charged particle beam, a first sample placement section, a diaphragm that separates a space where the first sample placement section is placed from the inside of the charged particle optical lens barrel, and a base table to which the diaphragm is fixed, wherein the method comprises:
    a first step of storing the height of the first sample placement section when a height adjustment member comes into contact with the diaphragm or the base table by moving the first sample placement section in the optical axis direction of the charged particle optical lens barrel;
    a second step of adjusting a specific point that indicates a position at a predetermined distance from an optical device uniquely determined for the optical device so that the specific point is located on the surface of the height adjustment member by moving at least a part of the optical device to change the distance between the optical device and the height adjustment member;
    a third step of placing a sample table with a Z-axis driving mechanism in the optical device and adjusting the height of the sample table with a Z-axis driving mechanism so that the surface of the sample is located at the position of the specific point of the optical device without changing the position of the specific point of the optical device adjusted in the second step; and
    a fourth step of adjusting a distance between the sample and the diaphragm by adjusting the height of the first sample placement section of the charged particle beam device or the height of the sample table with a Z-axis driving mechanism using the height of the first sample placement section stored in the first step.

2. The method for adjusting the height of a sample according to claim 1, wherein
    the fourth step is performed without changing the height of the sample table with a Z-axis driving mechanism adjusted in the third step.

3. The method for adjusting the height of a sample according to claim 1, wherein
    the optical device is an optical microscope, and
    the specific point of the optical device is the focal point of the optical microscope.

4. The method for adjusting the height of a sample according to claim 1, wherein
    the optical device is a distance measurement device using a laser, and
    the specific point of the optical device is the distance reference point of the distance measurement device.

5. The method for adjusting the height of a sample according to claim 1, wherein
    a moving mechanism capable of mechanically moving at least a part of the optical device in the optical axis direction of the optical device is included, and
    in the second step, the specific point of the optical device is adjusted so that the specific point is located on the surface of the height adjustment member by moving the moving mechanism.

6. The method for adjusting the height of a sample according to claim 1, wherein
    the height adjustment member includes a target object which can be observed with the optical device and the charged particle beam device, and
    a step of placing the target object in the field of view of the optical device and the charged particle beam device.

7. The method for adjusting the height of a sample according to claim 6, wherein
    the target object has a shape such that the target object does not protrude from the surface of the height adjustment member.

8. The method for adjusting the height of a sample according to claim 1, wherein
    the shape of a plane which is the surface of the height adjustment member and is closest to the diaphragm is larger than the window frame of the diaphragm and smaller than the base table.

9. The method for adjusting the height of a sample according to claim 1, wherein
    a face which is the surface of the height adjustment member and faces the diaphragm has a cavity.

10. The method for adjusting the height of a sample according to claim 9, wherein
    the shape of the cavity is larger than the window frame of the diaphragm and smaller than the base table.

11. The method for adjusting the height of a sample according to claim 1, wherein
    the sample table with a Z-axis driving mechanism has an XY-plane moving mechanism capable of moving in a planar direction perpendicular to the optical axis of the charged particle optical lens barrel.

12. The method for adjusting the height of a sample according to claim 1, wherein
    the sample table with a Z-axis driving mechanism is attachable to and detachable from the height adjustment member.

13. An observation system, comprising:
    a charged particle beam device which includes a charged particle optical lens barrel that generates a charged particle beam, a first sample placement section, a diaphragm that separates a space where a sample is placed from the inside of the charged particle optical lens barrel, and a base table to which the diaphragm is fixed;
    an optical device which includes a second sample placement section and is at least partially movable so that a distance between a specific point that indicates a position at a predetermined distance from the optical device uniquely determined for the optical device and the second sample placement section can be adjusted;
    a height adjustment member, in which a face facing the diaphragm is an upper surface larger than the window frame of the diaphragm, and which has a shape capable of being placed in the first sample placement section and the second sample placement section in common; and
    a sample table with a Z-axis driving mechanism which has a mechanism movable in the optical axis direction of the charged particle optical lens barrel, and has a shape capable of being placed in the first sample placement section and the second sample placement section in common.

14. The observation system according to claim 13, wherein
    the optical device is an optical microscope, and the specific point of the optical device is the focal point of the optical microscope.

15. The observation system according to claim 13, wherein
the optical device is a distance measurement device using a laser, and
the specific point of the optical device is the distance reference point of the distance measurement device.

16. The observation system according to claim 13, wherein
the optical device has a moving mechanism capable of mechanically moving at least a part of the optical device in the optical axis direction of the optical device.

17. The observation system according to claim 13, wherein
the height adjustment member includes a target object which can be observed with the optical device and the charged particle beam device, and
the target object has a size capable of being placed in the field of view of the optical device and the charged particle beam device.

18. The observation system according to claim 17, wherein
the target object has a shape such that the target object does not protrude from the surface of the height adjustment member.

19. The observation system according to claim 13, wherein
the shape of a plane which is the surface of the height adjustment member and is closest to the diaphragm is larger than the window frame of the diaphragm and smaller than the base table.

20. The observation system according to claim 13, wherein
a face which is the surface of the height adjustment member and faces the diaphragm has a cavity.

21. The observation system according to claim 20, wherein
the shape of the cavity is larger than the window frame of the diaphragm and smaller than the base table.

22. The observation system according to claim 13, wherein
the sample table with a Z-axis driving mechanism has an XY-plane moving mechanism capable of moving in a planar direction perpendicular to the optical axis of the charged particle optical lens barrel.

23. The observation system according to claim 13, wherein
the sample table with a Z-axis driving mechanism is attachable to and detachable from the height adjustment member.

* * * * *